United States Patent
Aikawa et al.

(10) Patent No.: US 7,119,625 B2
(45) Date of Patent: Oct. 10, 2006

(54) HIGH FREQUENCY OSCILLATOR USING TRANSMISSION LINE RESONATOR

(75) Inventors: Masayoshi Aikawa, Saga (JP); Takayuki Tanaka, Saga (JP); Fumio Asamura, Saitama (JP); Takeo Oita, Saitama (JP)

(73) Assignees: Nihon Dempa Kogyo Co., Ltd., Tokyo (JP); Saga University, Saga (JP)

( * ) Notice: Subject to any disclaimer, the term of this patent is extended or adjusted under 35 U.S.C. 154(b) by 77 days.

(21) Appl. No.: 11/046,360

(22) Filed: Jan. 28, 2005

(65) Prior Publication Data

US 2005/0174182 A1 Aug. 11, 2005

(30) Foreign Application Priority Data

Jan. 29, 2004 (JP) ............................. 2004-021405

(51) Int. Cl.
*H03B 5/12* (2006.01)

(52) U.S. Cl. .................... 331/107 SL; 331/56; 331/96; 331/177 V; 331/74

(58) Field of Classification Search ................. 331/56, 331/96, 107 SL, 177 V, 74
See application file for complete search history.

(56) References Cited

U.S. PATENT DOCUMENTS

| 6,703,904 B1 * | 3/2004 | Aikawa et al. ............... 331/56 |
| 6,798,305 B1 | 9/2004 | Aikawa et al. |
| 6,909,333 B1 * | 6/2005 | Aikawa et al. ............... 331/56 |

FOREIGN PATENT DOCUMENTS

JP 2003-152455 5/2003

* cited by examiner

*Primary Examiner*—Arnold Kinkead
(74) *Attorney, Agent, or Firm*—Knobbe Martens Olson & Bear, LLP

(57) ABSTRACT

A high frequency oscillator comprises a transmission line resonator having a midpoint which serves as a null potential point, a pair of active devices for oscillation respectively connected to a pair of mutually opposite-phase resonance wave points for the transmission line resonator, and a plurality of output lines each having one end connected to the transmission line resonator at a point symmetric to the midpoint, and the other end commonly connected to a connection. The pair of active devices share the resonator and oscillate in opposite phases to each other. The plurality of output lines are coupled to the transmission line resonator respectively at maximum displacement distribution points for a standing wave of an 2n-th harmonic in the transmission line resonator, where n is an integer equal to or larger than two. Even-order harmonic components of 2(n−1)-th or lower are suppressed at the connection.

21 Claims, 14 Drawing Sheets

HIGH FREQUENCY OSCILLATOR USING TRANSMISSION LINE RESONATOR

BACKGROUND OF THE INVENTION

1. Field of the Invention

The present invention relates to a high frequency oscillator for oscillating signals in a millimeter-wave band and a microwave band, and more particularly, to a high frequency oscillator which employs a transmission line resonator and is suitable for generation of a frequency four times or more higher than a fundamental oscillation frequency (i.e., fundamental wave) based on the resonator.

2. Description of the Related Art

High frequency oscillators suitable for generating oscillation signals in a millimeter-wave band and a microwave band are employed, for example, in optical communication systems and peripheral apparatuses associated therewith, and are required to improve the performance and reduce the cost. The present inventors have previously proposed such a high frequency oscillator which is a push-push oscillator using a transmission line resonator in Japanese Patent Laid-open Publication No. 2003-152455 (JP, P2003-152455A). This oscillator can generate signals at frequency twice or four times higher than a fundamental resonant frequency of the resonator in a simple structure. It should be noted that the push-push oscillator employs a pair of oscillation circuits which operate at the same fundamental frequency and in opposite phases to each other, and combines outputs of these oscillation circuits to cancel out fundamental wave components and extract even-order harmonic components to the outside.

FIG. 1 is a plan view illustrating the configuration of a conventional second-harmonic oscillator for generating a second harmonic signal which is a signal at a frequency twice as high as a fundamental resonant frequency of the oscillator.

This high frequency oscillator comprises transmission line resonator 1, active devices 2 for oscillation, and an output line 3. Transmission line resonator 1 is microstrip line resonator 1A comprised, for example, of a microstrip line, and has an elongated signal line routed on one principal surface of dielectric substrate 4. A ground conductor is disposed substantially over the entirety of the other principal surface of dielectric substrate 4. Microstrip line resonator 1A has a length of, for example, λ/2, where λ is the wavelength corresponding to a fundamental frequency (fundamental wave f0) of oscillation.

Each of active devices 2 for oscillation is comprised, for example, of FET (Field Effect Transistor) 2A. In the illustrated oscillator, FETs 2A are disposed at both ends of microstrip line resonator 1A, respectively. Each FET 2A has a gate connected to a corresponding end of microstrip line resonator 1A through capacitor 5 for providing loose coupling. By thus connecting the gates of FETs 2A, microstrip line resonator 1A has resonant wave points (i.e., antinodes or nodes of a standing wave) at both ends.

The gate of each FET 2A is applied with a bias voltage through another microstrip line, not shown. Each FET 2A has a drain connected to microstrip line 6a which is designed to provide a negative resistance, and supplied with an operating voltage from a power supply, not shown. Each FET 2A has a source grounded. Microstrip line 6a is configured to have an electrically open end, when viewed from the drain, with respect to the fundamental oscillation frequency.

Output line 3, which has a microstrip line structure, is connected to a midpoint of microstrip line resonator 1A in the longitudinal direction through capacitor 5 for providing loose coupling. It should be noted that by loosely coupling output line 3 and FETs 2A to microstrip line resonator 1A, microstrip line resonator 1A is improved in independence, and is prevented from being affected by FETs 2A and output line 3. Connected at a midpoint of microstrip line 1 is microstrip line 6b which has a length of λ/4, and an open distal end. This microstrip line 6b, which is a so-called quarter wavelength stub, functions as an electrically short-circuited point with respect to a fundamental wave component f0, when viewed from a point at which it is connected to the resonator.

In this high frequency oscillator, equivalently, active devices 2, each comprised of FET 2A and having a negative resistance, are connected to both ends of microstrip line resonator 1A through electric field coupling. Therefore, for example, as illustrated in FIG. 2, a standing wave of fundamental wave f0 is generated with a null potential point located at the midpoint of microstrip line resonator 1A, and maximum displacement distribution points located at both ends of microstrip line resonator 1A which are resonant wave points, at which the standing wave is in an opposite phase relationship to each other. Also, other standing waves are generated corresponding to n-th harmonic n×f0 of fundamental wave f0, where n is an integer equal to or larger than two. In FIG. 2, the standing wave of fundamental wave f0 is represented by a solid line; a standing wave of second harmonic wave 2f0 is represented by a broken line; and a standing wave of third harmonic wave 3f0 is represented by a one-dot chain line. Among these standing waves, fundamental wave f0 has the highest level, and the level becomes lower as harmonics have higher order numbers.

In the foregoing configuration, since the negative resistive devices (FETs 2A) are disposed at both ends of microstrip line resonator 1A, i.e., resonant wave points, there are formed two oscillation systems which share the microstrip line resonator for fundamental wave f0 and higher-harmonics n×f0 components. Since both ends of microstrip line resonator 1A are reverse-level potential points to each other in the oscillation system associated with fundamental wave f0, the two oscillation systems oscillate in opposite phases to each other. Then, since output line 3 is connected to the midpoint of microstrip line resonator 1A, which is an electrically short-circuited point, i.e., a null potential point with respect to fundamental wave f0, fundamental wave f0 is not delivered from output line 3. Also, for third harmonic or higher harmonic components (2n−1)×f0, i.e., odd-order harmonics of fundamental wave f0, the midpoint of microstrip line resonator 1A serves as a null potential point, thus preventing these harmonic components from being delivered from output line 3, in a manner similar to fundamental wave f0.

The standing wave of second harmonic 2f0 relative to fundamental wave f0, has maximum displacement distribution points at the midpoint and both ends of microstrip line resonator 1A at which the standing wave is in opposite phases to each other. Since output line 3 is connected to such a midpoint, second harmonic 2f0 is generated at output terminal $f_{out}$ which is the other end of output line 3. In this way, the high frequency oscillator can provide an oscillation frequency which is twice higher than fundamental wave f0.

A standing wave of fourth or more even-order harmonic 2n×f0 also has a maximum displacement distribution point at least at the midpoint of microstrip line resonator 1A, and is in opposite phase or in phase to the midpoint at both ends.

As a result, a fourth or more even-order harmonic is similarly generated from output line 3, but has an output level relatively low as compared with the second harmonic component.

FIG. 3 illustrates the second-harmonic oscillators, illustrated in FIG. 1, arranged in parallel on the same substrate 4, and a microstrip line (first output line 3A) having a length of $\lambda/4$, where $\lambda$ is the wavelength of fundamental wave f0, disposed between the second-harmonic oscillators. First output line 3A has one end connected to a midpoint of microstrip line resonator 1A through capacitor 5 for loose coupling, and the other end connected to a midpoint of the other microstrip line resonator 1A through capacitor 5 for loose coupling. In other words, first output line 3A has a length equivalent to one-half wavelength with respect to a second harmonic component 2f0, and connects the midpoints of both microstrip line resonators 1A to each other. Further, second output line 3B is connected to a midpoint of first output line 3A through capacitor 5 for loose coupling. Further connected at the midpoint of each microstrip line 1A is microstrip line 6b which has an open distal end, but unlike the one illustrated in FIG. 1, microstrip line 6b has a length of $\lambda/8$, which is one quarter of the wavelength of second harmonic 2f0 wave.

In the foregoing configuration, second harmonic 2f0 is delivered to first output line 3A from each second-harmonic oscillator, while fundamental wave f0 is suppressed. Then, first output line 3A functions as a half-wavelength resonator for second harmonic 2f0, and similar to the foregoing case, the midpoint of first output line 3A serves as a null potential point with respect to the standing wave of second harmonic 2f0. On the other hand, the midpoint of first output line 3A serves as a maximum displacement distribution point for the standing wave of fourth harmonic 4f0. For this reason, a second harmonic 2f0 component is also suppressed, so that fourth harmonic 4f0 and higher even-order components are only generated on second output line 3B. In this event, since fourth harmonic component 4f0 is prominent among other even-order harmonic components, the circuit illustrated in FIG. 3 functions as a fourth-harmonic oscillator for generating the fourth harmonic, which has a frequency four times as high as that of fundamental wave f0.

As described above, it is possible to implement a high frequency oscillator for generating $2^n$-th harmonic component $2^n \times f0$, where n is an integer equal to or larger than two, by repeatedly combining two high frequency oscillators for generating a lower order harmonic to form a higher-order harmonic oscillator.

While microstrip line resonator 1A has been described to be linear in the foregoing discussion, the oscillator also operates in a similar manner when microstrip line resonator 1A is formed into an annular or ring shape.

The high frequency oscillators configured as described above, however, have the following problems.

Basically, a second-harmonic oscillator can be made up of one microstrip line resonator 1A having a length of $\lambda/2$, and two negative resistive devices at both ends thereof, where $\lambda$ is the wavelength corresponding to the fundamental frequency of oscillation, i.e., fundamental wave f0. However, since a fourth-harmonic oscillator requires a pair of second-harmonic oscillators which cause the resulting oscillator to be large in size, and therefore hampers a reduction in size of the oscillator. Likewise, for providing a $2^n$-th harmonic oscillator for generating an eighth harmonic or a higher-order harmonic ($n \geq 3$), a pair of $2^{(n-1)}$-th harmonic oscillators are required, and further hamper a reduction in size of the oscillator.

SUMMARY OF THE INVENTION

It is an object of the present invention to provide a high frequency oscillator which is capable of generating a frequency component four times higher than a fundamental wave of oscillation, and lends itself to a reduction in size.

The object of the present invention is achieved by a high frequency oscillator which includes a transmission line resonator having a midpoint which serves as a null potential point, a pair of active devices for oscillation respectively connected to a pair of resonance wave points for the transmission line resonator, the resonance wave points being in a mutually opposite-phase relationship, and a plurality of output lines each having one end connected to the transmission line resonator at a point symmetric to the midpoint, and the other end commonly connected to a connection, wherein the the pair of active devices share the transmission line resonator as a high frequency resonator to make up a pair of oscillation systems which oscillate in opposite phases to each other at a fundamental frequency depending on length of the transmission line resonator, a standing wave of an even-order harmonic of the fundamental frequency has one of maximum displacement distribution points at the midpoint on the transmission line resonator, the plurality of output lines are coupled to the transmission line resonator respectively at maximum displacement distribution points for a standing wave of an 2n-th harmonic on the transmission line resonator, the standing wave being in opposite phase to that at the midpoint, where n is an integer equal to or larger than two, and even-order harmonic components of 2(n−1)-th or lower are suppressed at the connection.

In the high frequency oscillator described above, since the midpoint of the transmission line resonator serves as a null potential point, standing waves of fundamental wave f0 and its odd-order harmonics distribute in bilateral symmetry about the midpoint. Thus, even if the standing waves of the fundamental wave and odd-order harmonics are delivered from the output lines arranged symmetrically about the midpoint, they are combined in opposite phases at the connection, with the result that the fundamental wave or odd-order harmonics are not delivered to the outside.

The plurality of output lines are respectively coupled to the transmission line resonator at maximum displacement distribution points for a standing wave of 2n-th harmonic, at which the standing wave is in opposite phase to that at the midpoint. Consequently, the 2n-th harmonics are combined in phase and delivered from the connection. On the other hand, as to second to 2(n−1)-th harmonics, some of standing waves associated with these harmonics have null potential at the positions at which the output lines are connected to the resonator. Other harmonic components are also combined in opposite phases at the connection, and as a result delivered at null potential. While 2(n+1)-th and higher harmonics are also generated, they are relatively low in level and can be readily removed by a simple filter, with the result that the 2n-th harmonic alone is generated as an oscillation output.

According to the present invention, since a fourth harmonic or an eighth harmonic of a fundamental frequency, for example, can be generated only by connecting negative resistive active devices respectively at a pair of resonance wave points for a transmission line resonator which is a resonator for the fundamental wave, a high frequency oscillator can be readily reduced in size. Also, the high frequency oscillator of the present invention is suitable for incorporation into MMIC (Monolithic microwave integrated circuit).

DETAILED DESCRIPTION OF THE PREFERRED EMBODIMENTS

Figure 5:
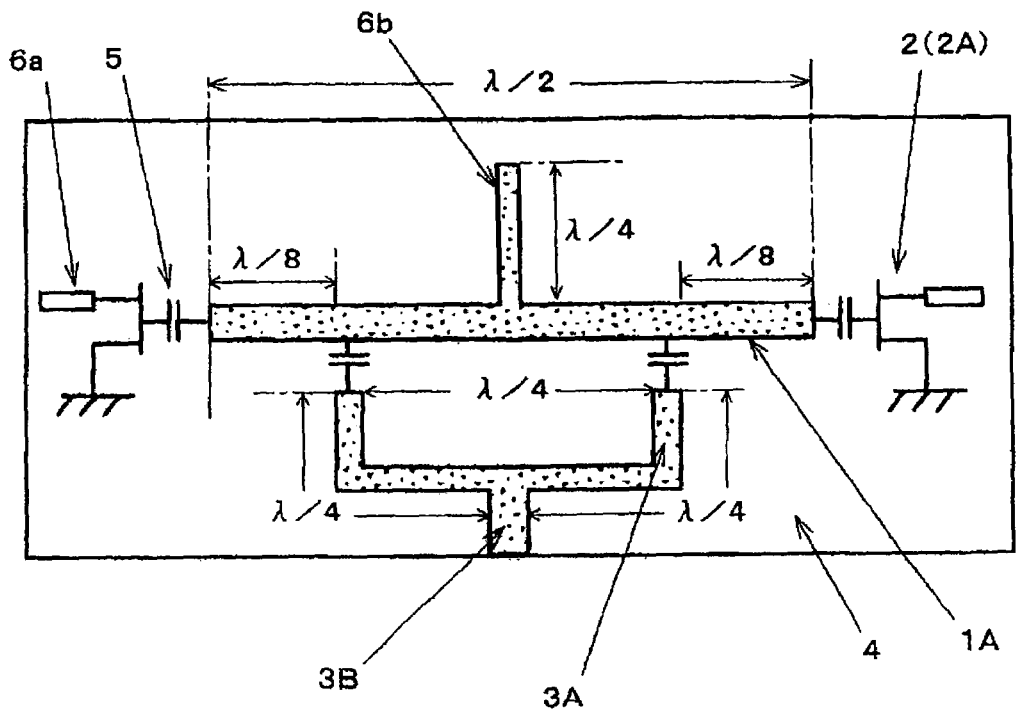
FIG. 5 is a plan view illustrating a fourth-harmonic oscillator according to a first embodiment of the present invention.

A high-frequency oscillator according to a first embodiment of the present invention, illustrated in FIG. 5, employs a linear microstrip line resonator as a transmission line resonator, and is designed to function as a fourth-harmonic oscillator which generates a signal having a frequency four times as high as a frequency of fundamental wave f0 . . . .

Figure 1:
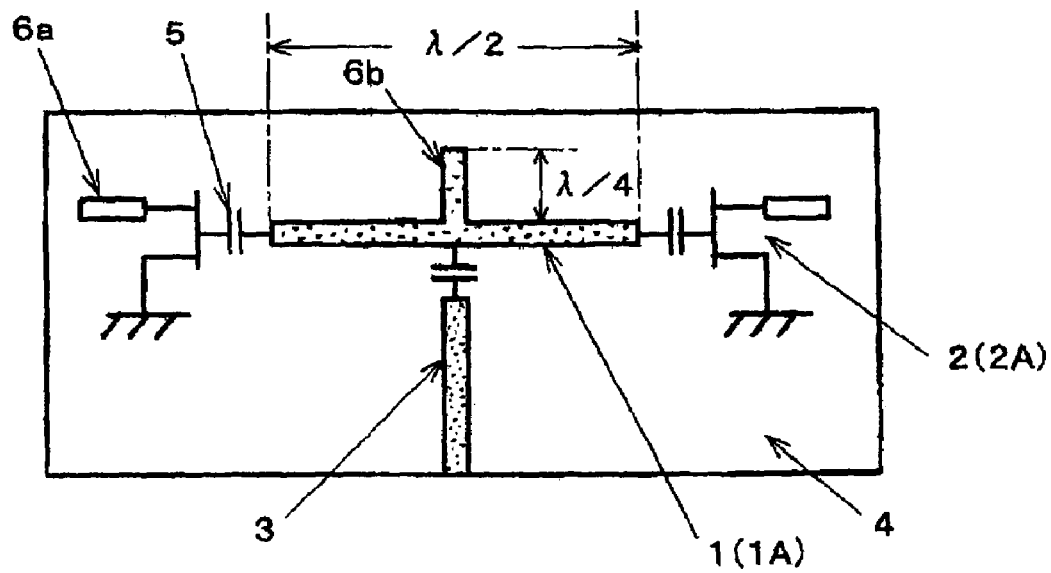
FIG. 1 is a plan view illustrating a conventional second-harmonic oscillator.
Figure 2:
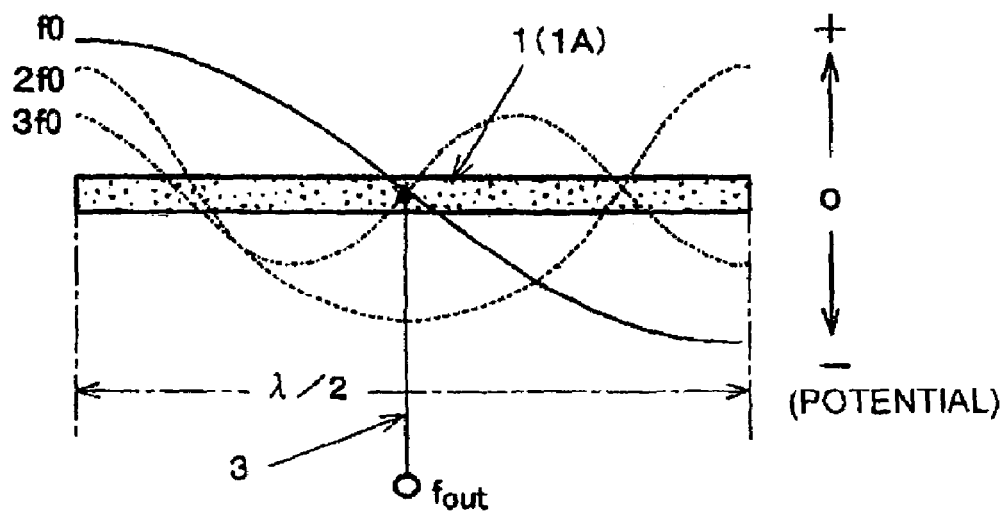
FIG. 2 is a graph showing a displacement distribution of standing waves in the circuit illustrated in FIG. 1.
Figure 3:
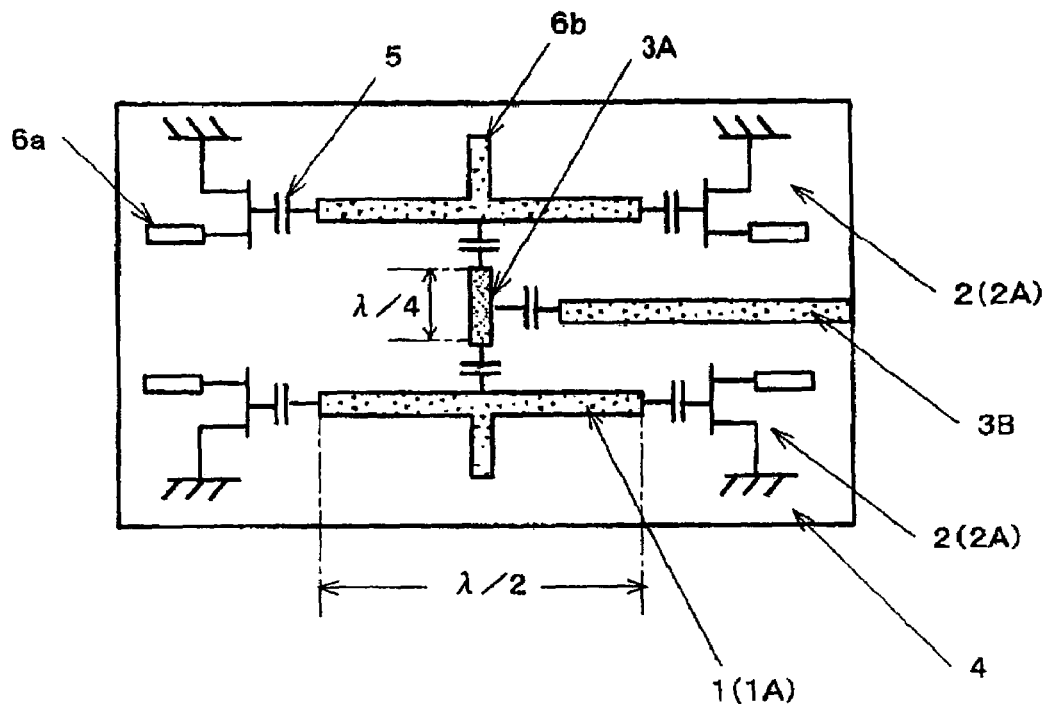
FIG. 3 is a plan view illustrating a conventional fourth-harmonic oscillator.
Figure 4:
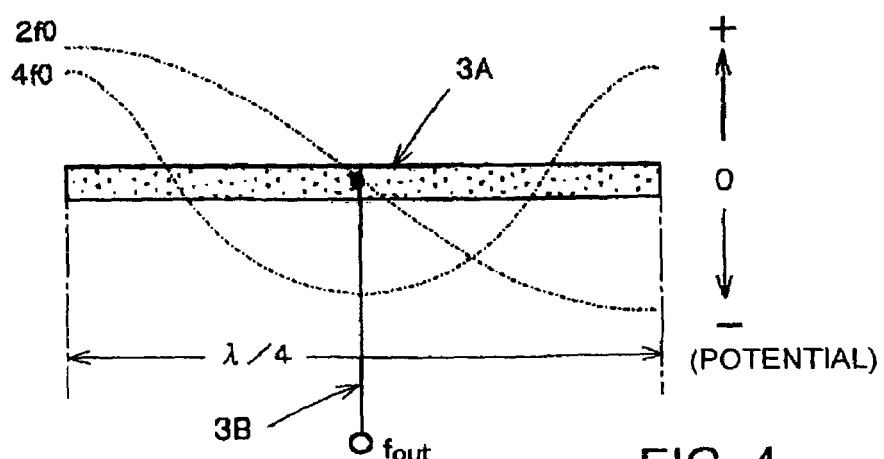
FIG. 4 is a graph showing a displacement distribution of standing waves in the circuit illustrated in FIG. 2.

In FIG. 5, components identical to those in FIGS. 1 and 3 are designated the same reference numerals, and repeated description thereon is simplified.

Figure 6:
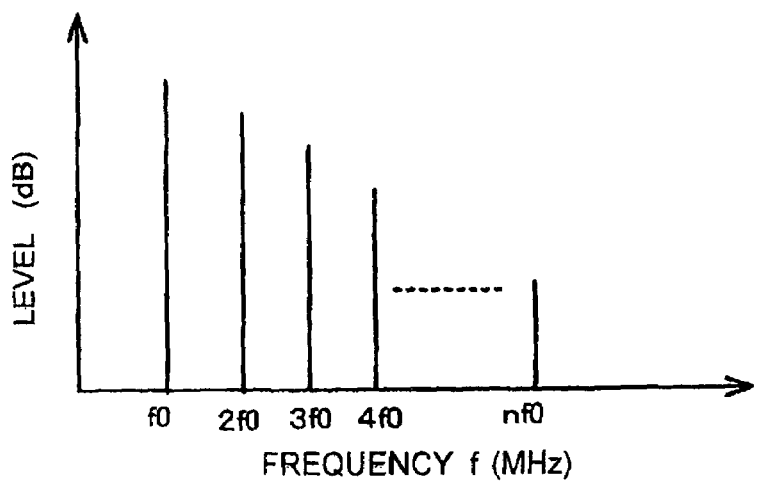
FIG. 6 is a spectrum diagram representing a frequency distribution in an output waveform of an FET in the oscillator illustrated in FIG. 5.

The fourth-harmonic oscillator illustrated in FIG. 5 comprises linear microstrip line resonator 1A having a length of $\lambda/2$, where $\lambda$ is the wavelength of fundamental oscillation frequency (fundamental wave) f0; negative resistive active devices (FETs 2A) connected at both ends of microstrip line oscillator 1A, respectively; two first output lines 3A; and second output line 3B. These resonator 1A, FETs 2A, and output lines 3A, 3B are disposed on one principal surface of dielectric substrate 4, while a ground conductor is disposed substantially over the entirety of the other principal surface of substrate 4. Each of FETs 2A has a gate connected to an end of microstrip line resonator 1A through a capacitor for loose coupling in a manner similar to the foregoing; a drain connected to microstrip line 6B similar to the foregoing; and a source grounded. In this embodiment, a bias voltage value which is applied to the gate of FET 2A, i.e., negative resistive device, is changed from that of the conventional oscillator so that the oscillation waveform distorts to increase the level of harmonic components relative to a basic wave component, as shown in FIG. 6. FIG. 6 shows exemplary levels of the fundamental wave component and harmonic components included in the output of FET 2A, resulting from the distortion of the oscillation waveform.

Figure 7A:
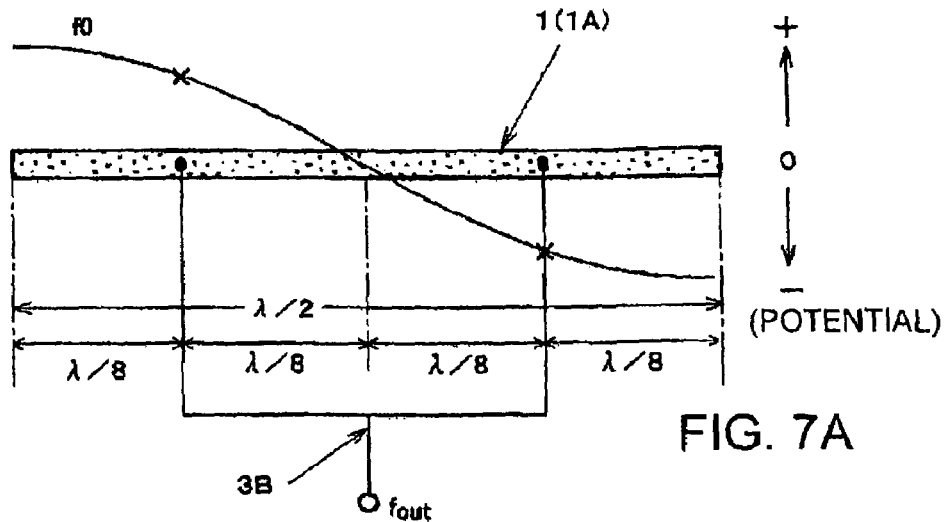
FIGS. 7A to 7C are graphs each representing a displacement distribution of a standing wave in the circuit illustrated in FIG. 5.
Figure 7B:
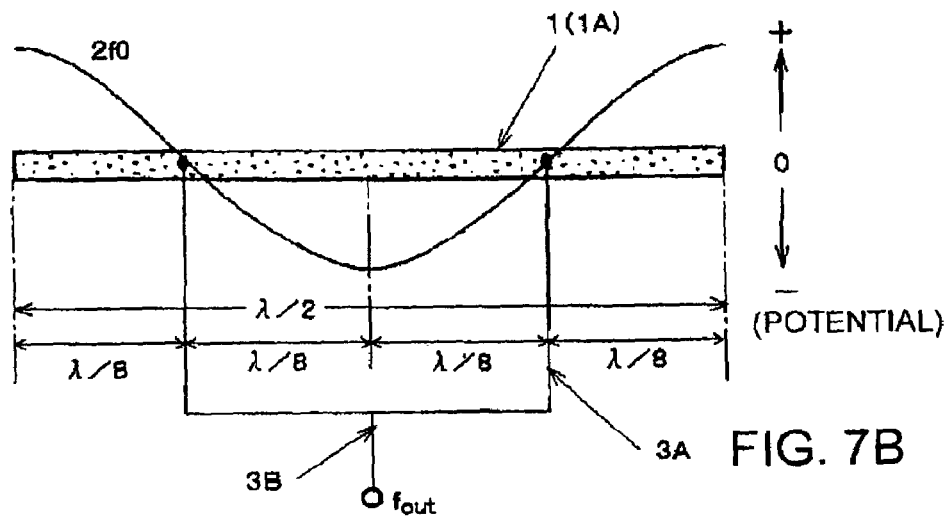
Figure 7C:
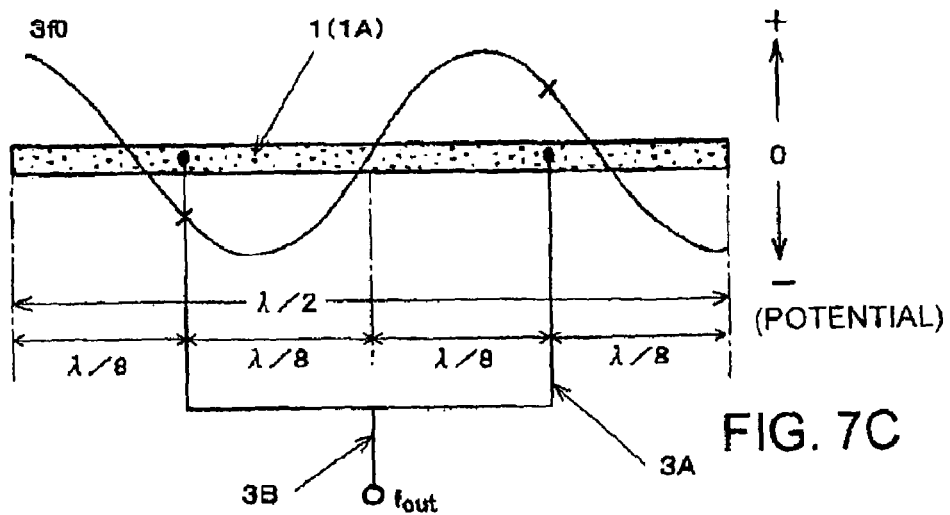

As described above, connected at a midpoint of microstrip line resonator 1A in the longitudinal direction is microstrip line 6b which has a length of $\lambda/4$ and an open distal end, for generating a standing wave of fundamental wave f0 on microstrip line resonator 1A. The standing wave has a null potential at the midpoint of resonator 1A, and has opposite-phase maximum displacement distribution points at both ends of resonator 1A. Similarly, generated on microstrip line resonator 1A are standing waves of odd-order harmonics of fundamental wave f0 which are inverse symmetric about the midpoint, and standing waves of even-order harmonics $2n \times f0$ having a maximum displacement distribution point at least at the midpoint. FIG. 7A represents a potential displacement distribution for the standing wave of fundamental wave f0 in microstrip line resonator 1A; FIG. 7B represents a potential displacement distribution for a standing wave of second harmonic 2f0; FIG. 7C represents a potential displacement distribution for a standing wave of a third harmonic 3f0; and FIG. 8 represents a potential displacement distribution for a standing wave of fourth harmonic 4f0.

Figure 8:
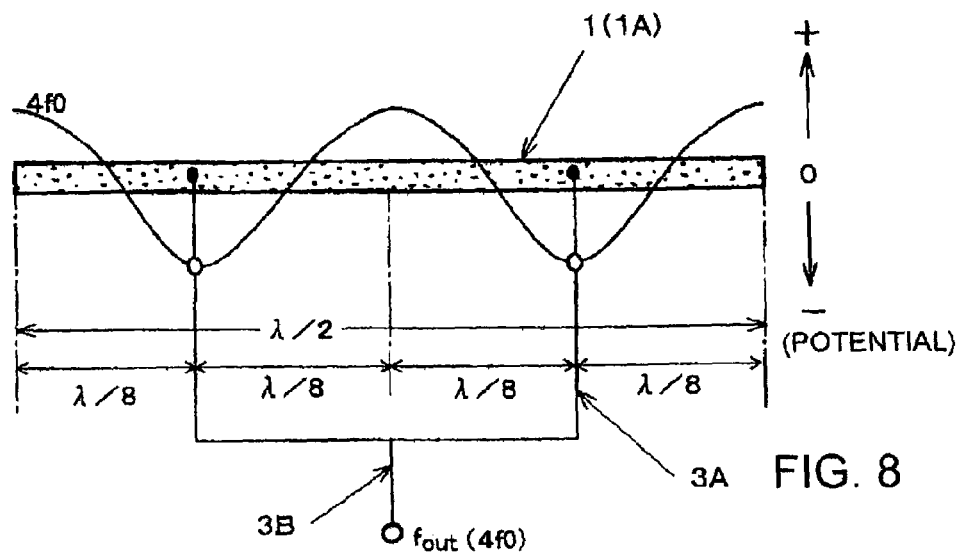
FIG. 8 is a graph representing a displacement distribution of a standing wave in the circuit illustrated in FIG. 5.

As illustrated in FIG. 8, in regard to the standing wave of fourth harmonic 4f0, the distribution of the standing wave is bilaterally symmetric about the midpoint of microstrip line resonator 1A, and has a total of five-maximum displacement distribution points which appear at the positions of ¼ and ¾ of the overall length of microstrip line resonator 1A, in addition to the midpoint and both end points of microstrip line resonator 1A. Among these points, the standing wave of fourth harmonic 4f0 is in phase at the midpoint and both end points. At the ¼ and ¾ length points, the standing wave of fourth harmonic 4f0 is in opposite phase to and at the same potential point as the midpoint. Bearing the foregoing in mind, the fourth-harmonic oscillator of this embodiment has first output lines 3A which are connected to microstrip line resonator 1A at both the ¼ and ¾ positions of the overall length thereof, respectively, through capacitors 5 for loose coupling. In other words, a pair of first output lines 3A have their proximal ends connected to two points at a distance of $\lambda/8$ from the midpoint and the two ends of microstrip line resonator 1A. First output lines 3A are both $\lambda/4$ long, and have the distal ends connected in common. Second output line 3B is connected to the connection at which the distal ends of first output lines 3A are connected to each other. Output $f_{out}$ is generated at the distal end of second output line 3B.

In the fourth-harmonic oscillator as described above, the two points of microstrip line resonator 1A, at which first output lines 3A are connected, are reverse potential points, as indicated by "x" marks in FIGS. 7A and 7C at which an odd-order harmonic such as fundamental wave f0, third harmonic 3f0 and the like is at reverse potentials. Since the pair of first output lines 3A are commonly connected to second output line 3B, the potentials of odd-order frequency components in opposite phases to each other are canceled out, resulting in null potential appearing at the common connection point. Consequently, no odd-order components are delivered to output terminal $f_{out}$.

In regard to the standing wave of second harmonic 2f0, as shown in FIG. 7B, it has null potential at the positions at which first output lines 3A are connected to microstrip line resonator 1A. Therefore, the second harmonic component 2f0 is not delivered to output line 3A, or to output terminal $f_{out}$ of second output line 3B, as a matter of course.

In regard to the standing wave of fourth harmonic 4f0, as indicated by circles in FIG. 8, it has in-phase maximum displacement distribution points at the two positions of microstrip line resonator 1A at which first output lines 3A are connected, so that a fourth harmonic component 4f0 is delivered to the pair of first output lines 3A in phase. Since the pair of first output lines 3A are commonly connected to second output line 3B while the delivered fourth harmonic components remain in phase, fourth harmonic 4f0 is delivered to output terminal $f_{out}$ of second output line 3B.

As appreciated from the foregoing, the fourth-harmonic oscillator of this embodiment suppresses fundamental wave f0, second harmonic 2f0, and third harmonic 3f0, and generates only fourth harmonic component 4f0. As described above, the fourth-harmonic oscillator does not either deliver fifth or higher odd-order harmonics. Further, since sixth or higher even-order harmonics are at low levels relative to fourth harmonic 4f0, these even-order harmonics will not impede the delivery of the fourth harmonic component 4f0. If one wishes to remove the influence of the sixth or higher even-order harmonics, a simple filter may be provided to readily suppress these higher harmonic components.

As described above, the fundamental wave and odd-order harmonics have null potential at the point at which the pair of first output lines 3A are commonly connected to output line 3B because voltages are added in opposite phases. Since each of first output lines 3A has a length of λ/4, the output side of first output line 3A appears to present an infinity impedance with respect to the fundamental wave f0 and odd-order harmonics from the position at which first output line 3A is connected to microstrip lines 1A. Thus, the fundamental wave component f0, which has the highest level in resonator 1A, is further suppressed to have a lower level on the output side of first output line 3A. Further, the output waveform of resonator 1A is distorted by setting the bias potential and the like, so that fourth harmonic 4f0 has a higher level in this resonator. Consequently, the oscillator facilitates the extraction of fourth harmonic 4f0.

In the foregoing description, while microstrip line resonator 1A is linear, microstrip line resonator 1A may be arranged, for example, in a meander pattern.

Figure 9:
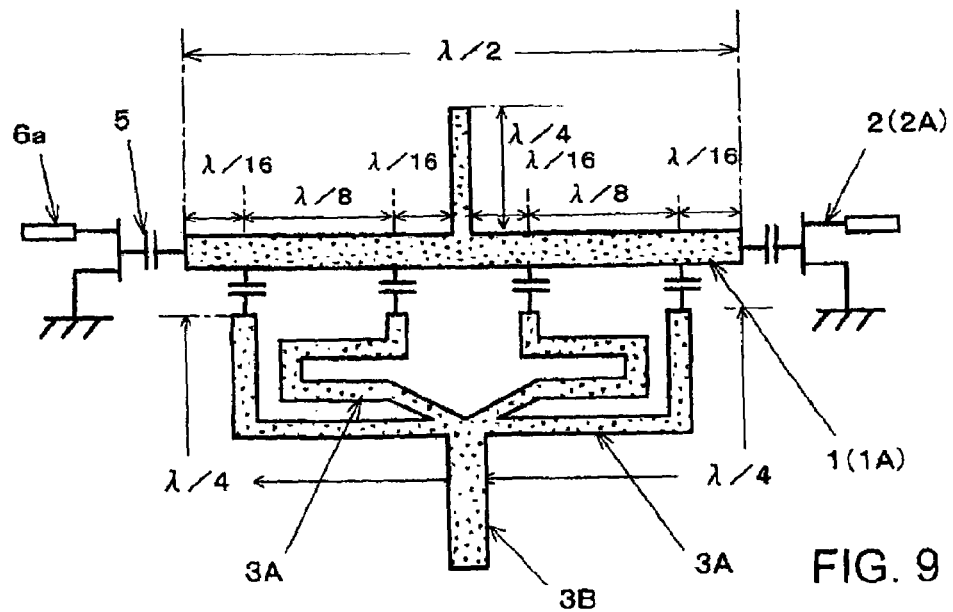
FIG. 9 is a plan view illustrating an eighth-harmonic oscillator according to a second embodiment of the present invention.

FIG. 9 illustrates a high frequency oscillator according to a second embodiment of the present invention which is configured to function as an eighth-harmonic oscillator though it has a similar configuration to that illustrated in FIG. 5. In FIG. 9, components identical to those in FIG. 5 are designated the same reference numerals and repeated description thereon is simplified.

The eighth-harmonic oscillator comprises microstrip line resonator 1A having a length of λ/2, where λ is the wavelength corresponding to the fundamental frequency (fundamental wave) of oscillation; negative resistive active devices (FETs 2A) connected to both ends of microstrip line resonator 1A, respectively, and having their oscillation waveforms distorted by bias setting; first output lines 3A; and second output line 3B, in a manner similar to the fourth-harmonic oscillator illustrated in FIG. 5. This fourth-harmonic oscillator has, however, four first output lines 4A.

Figure 10A:
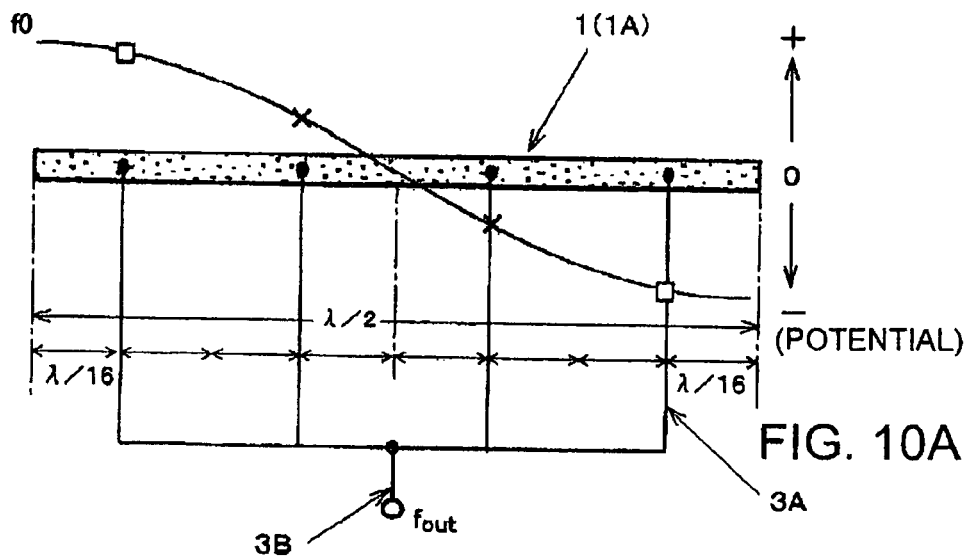
FIGS. 10A to 10C are graphs each representing a displacement distribution of a standing wave in the circuit illustrated in FIG. 9.
Figure 10B:
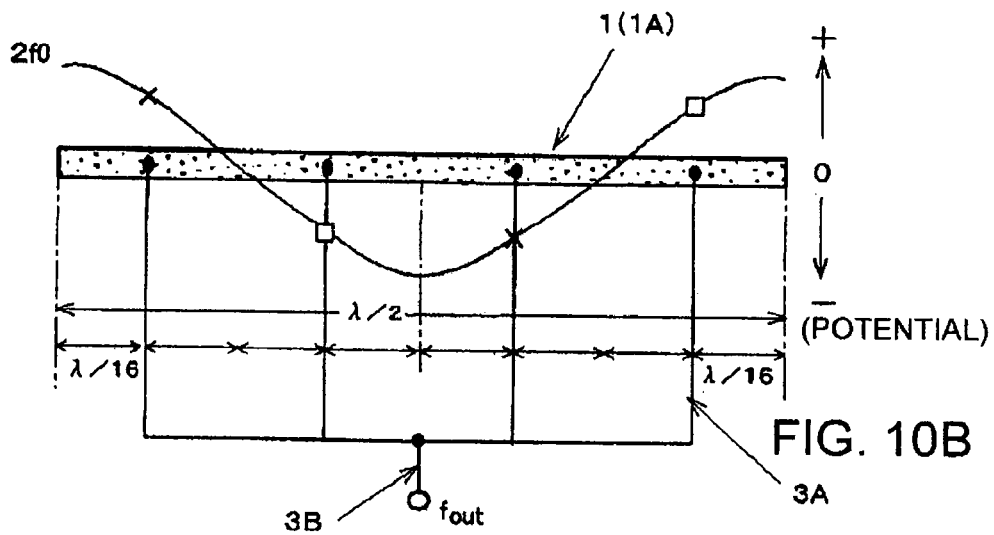
Figure 10C:
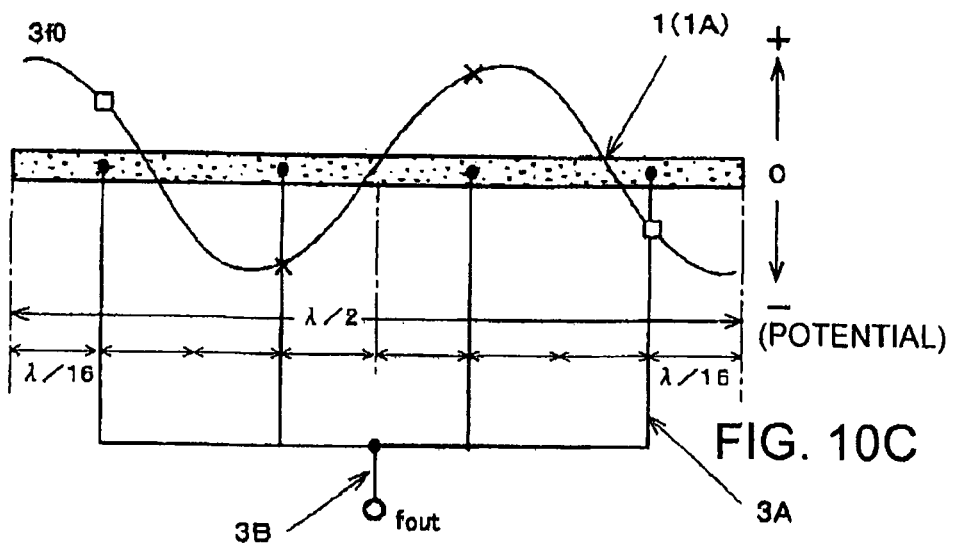
Figure 11A:
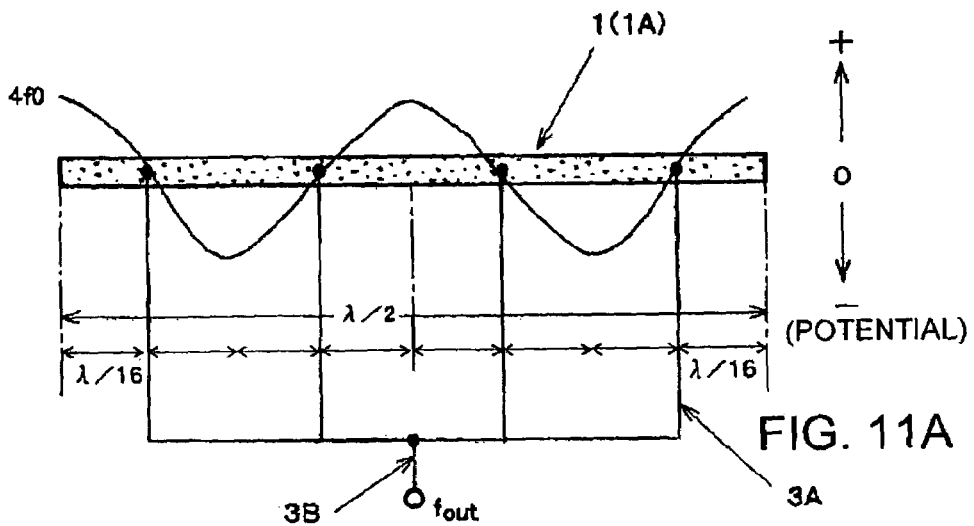
FIGS. 11A to 11C are graphs each representing a displacement distribution of a standing wave in the circuit illustrated in FIG. 9.
Figure 11B:
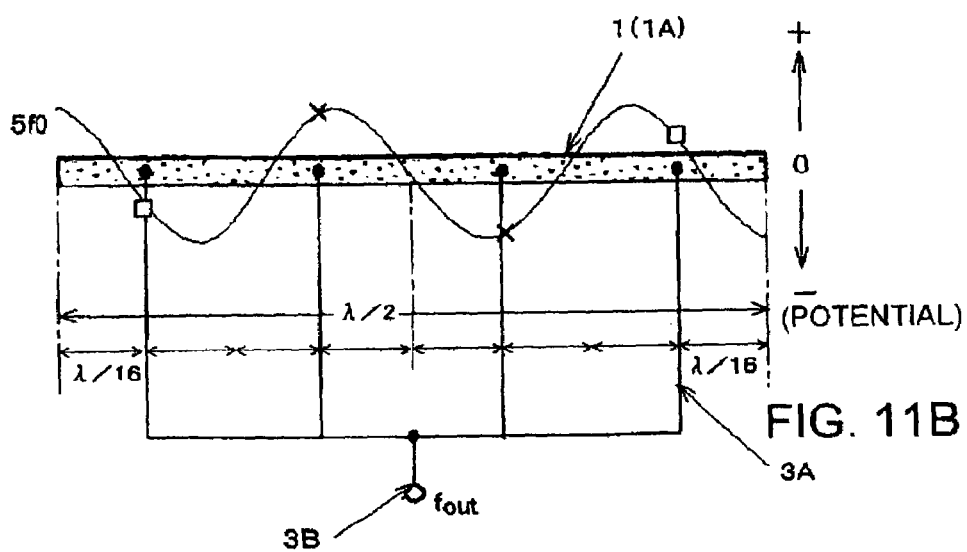
Figure 11C:
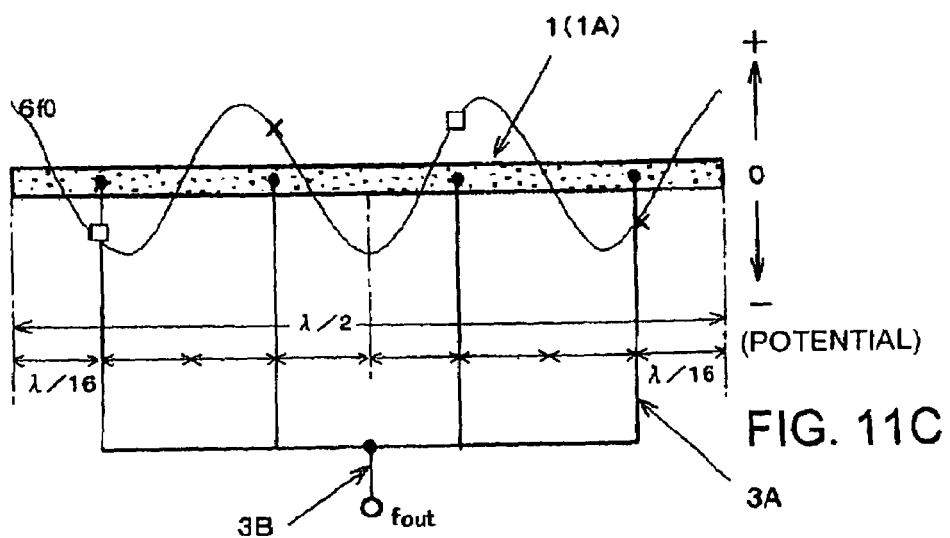
Figure 12A:
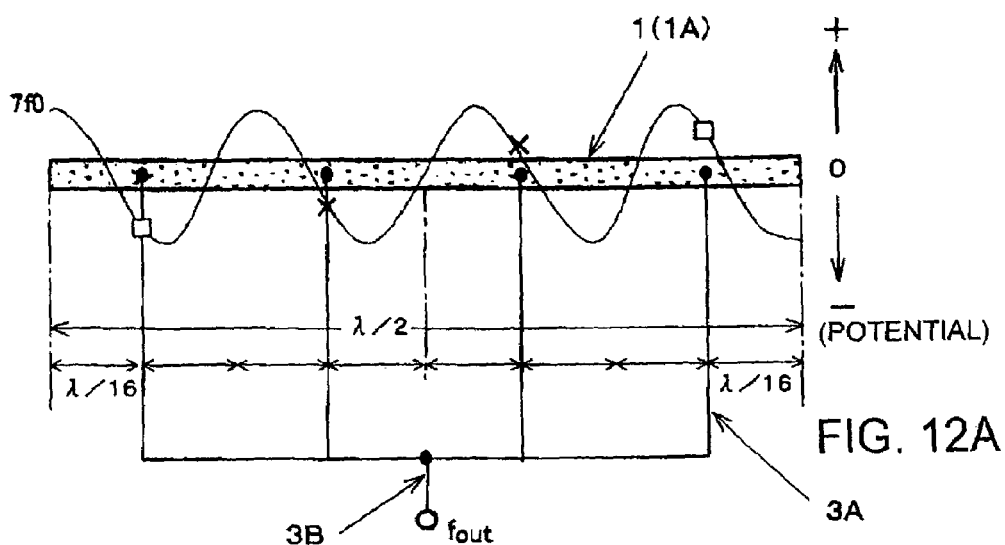
FIGS. 12A and 12B are graphs each representing a displacement distribution of a standing wave in the circuit illustrated in FIG. 9.

Likewise, in the configuration of the second embodiment, generated on microstrip line resonator 1A are standing waves of fundamental wave f0 and its odd-order harmonics, each of which is inverse symmetric about the midpoint of microstrip line resonator 1A in the longitudinal direction, and standing waves of even-order harmonics 2nf0, each of which has a maximum displacement distribution point at the midpoint and distributes symmetrically about the midpoint. FIG. 10A represents a potential displacement distribution for the standing wave of fundamental wave to in microstrip line resonator 1A; FIG. 10B represents a potential displacement distribution for a standing wave of second harmonic 2f0; FIG. 10C represents a potential displacement distribution for a standing wave of a third harmonic 3f0; and FIG. 11A represents a potential displacement distribution for a standing wave of fourth harmonic 4f0; FIG. 11B represents a potential displacement distribution for a standing wave of fifth harmonic 5f0; FIG. 11C represents a potential displacement distribution for a standing wave of sixth harmonic 6f0; FIG. 12A represents a potential displacement distribution for a standing wave of seventh harmonic 7f0; and FIG. 12B represents a potential displacement distribution for a standing wave of eighth harmonic 8f0.

Figure 12B:
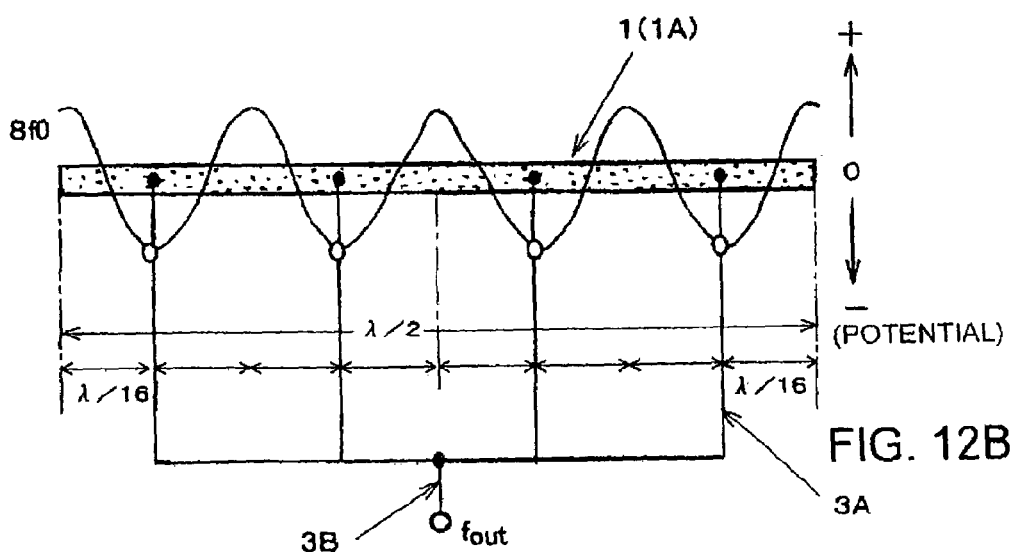

As shown in FIG. 12B, in regard to the standing wave of eighth harmonic 8f0, the distribution of the standing wave is bilaterally symmetric about the midpoint of microstrip line resonator 1A, and has a total of nine maximum displacement distribution points which appear at positions of ⅛, ¼, ⅜, ⅝, ⅗, and ⅞ of the overall length of microstrip line resonator 1A, in addition to the midpoint and both end points of microstrip line resonator 1A.

Here, four first output lines 3A are connected to four maximum displacement distribution points which are maximum displacement distribution points for the standing wave of the eighth harmonic, and at which the standing wave of eighth harmonic is in opposite phase to that at the midpoint of microstrip line resonator 1A. Specifically, first output lines 3A are connected to two points distanced by λ/16 from the midpoint of microstrip line resonator 1A on both sides, and at two points distance by λ/16 from both ends of microstrip line resonator 1A toward the midpoint. Each of first output lines 3A has a length of λ/4, and has its distal end commonly connected to one end of second output line 3B. Output $f_{out}$ is generated from the other end of second output line 3B.

In the configuration as described above, among the four points of microstrip line resonator 1A at which first output lines 3A are respectively connected, the standing waves of odd-order harmonics (2n−1)×f0 such as fundamental wave f0, third harmonic 3f0, fifth harmonic 5f0, seventh harmonic 7f0 and the like have reverse potentials to each other at the two points adjacent to the midpoint on both sides, as indicted by "x" marks In FIGS. 10A, 10C, 11B, and 12A. Similarly, among the four points of microstrip line resonator 1A at which first output lines 3A are connected, standing waves of odd-order harmonics (2n−1)f0 have reverse potentials to each other at two points adjacent to both ends of microstrip line resonator 1A, as indicated by square marks in the figures. These four first output lines 3A have the same length and are commonly connected to second output line 3B, so that potentials in opposite phases to each other are canceled out, thus preventing fundamental wave f0 and odd-order harmonics from appearing on output terminal $f_{out}$ of second output line 3B.

Also, in regard to standing waves of second harmonic 2f0 and sixth harmonic 6f0 among even-order harmonics, there are two sets of two points in the four points at which first output lines 3A are connected to microstrip line resonator 1A, at which these standing waves have reverse potentials to each other, as indicated by "x" marks and square marks in FIGS. 10B and 10C. Consequently, the second harmonic (2f0) and sixth harmonic (6f0) components do not appear on second output line 3B.

In regard to the standing wave of fourth harmonic 4f0 among the even-order harmonics, the standing wave has null potential at the four points of microstrip line resonator 1A at which first output lines 3A are connected, as shown in FIG. 11A. Therefore, the fourth harmonic component 4f0 does not appear either on first output lines 3A or at output terminal $f_{out}$ of second output line 3B.

In regard to the standing wave of eighth harmonic 8f0 among the even-order harmonics, the standing wave has mutually in-phase maximum displacement distribution points at the four points of microstrip line resonator 1A at which first output lines 3A are connected, as is also shown in FIG. 12B. Since the eighth harmonic components are delivered to first output lines 3A and are combined still in phase by second output line 3B, eighth harmonic 8f0 is delivered to output terminal $f_{out}$.

In this way, the eighth-harmonic oscillator of this embodiment suppresses the respective components from fundamental wave f0 to seventh harmonic 7f0, and generates only the eighth harmonic component 8f0. As described above, ninth or higher odd-order harmonics are not either delivered. Further, since tenth or higher even-order harmonics have low levels relative to eighth harmonic 8f0, these even-order harmonics will not hamper the delivery of eighth harmonic component 4f0. If one wishes to remove the influence of the tenth or higher even-order harmonics, a simple filter may be provided to readily suppress these higher harmonic components.

Since each of first output lines 3A has a length of $\lambda/4$ as well in this eighth-harmonic oscillator, the output side of first output line 3A appears to present an infinity impedance with respect to the fundamental wave f0 and odd-order harmonics from the positions at which first output lines 3A are connected to microstrip line 1A. Thus, the fundamental wave component f0, which has the highest level in resonator 1A, is further suppressed to have an even lower level on the output side.

As described above, since the output waveforms of the negative resistive devices are distorted by setting the bias potential and the like, eighth harmonic 8f0 has a higher level in this resonator. Consequently, the oscillator facilitates the extraction of eighth harmonic 8f0. While the high frequency oscillator described above employs a linear microstrip line as a transmission line resonator, the transmission line resonator is not limited to this shape. For example, the high frequency oscillator may employ a transmission line resonator in a closed loop shape.

Figure 13:
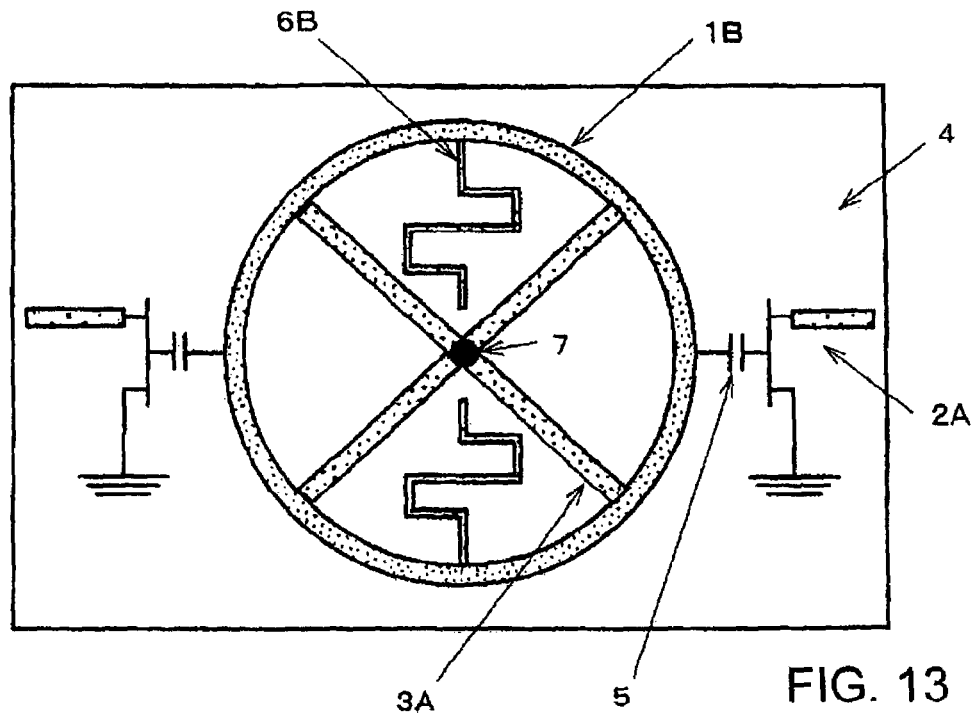
FIG. 13 is a plan view illustrating a fourth-harmonic oscillator according to a third embodiment of the present invention.

A high frequency oscillator according to a third embodiment of the present invention illustrated in FIG. 13 is a fourth-harmonic oscillator which employs a microstrip line resonator formed in a loop shape to function as a loop-shaped transmission line resonator.

Annular microstrip line resonator 1B is formed on one principal surface of substrate 4 made of a dielectric material. The overall length of microstrip line resonator 1B, i.e., the perimeter of the annular ring is equivalent to one wavelength of fundamental wave f0. A ground conductor is disposed substantially over the entirety of the other principal surface of substrate 4. The wavelength of fundamental wave f0 is represented by $\lambda$. Negative resistive active devices (FETs 2A) are connected at both ends of a certain diameter of microstrip line resonator 1B, at a right end and a left end of resonator 1B in FIG. 13 through capacitors 5 for loose coupling, respectively. Therefore, both negative resistive active devices are spaced by $\lambda/2$ away from each other in resonator 1B. The high frequency oscillator of the third embodiment is similar to the foregoing embodiments in that each FET 2A has a gate connected to microstrip line resonator 1B through capacitor 5, a drain connected to microstrip line 6a, and a source grounded.

In microstrip line resonator 1B, at positions regarded as midpoints between the pair of negative resistive active elements, i.e., at a top end and a bottom end in the illustrated example, there are connected microstrip lines 6B each having a length of $\lambda/4$ and an open distal end. When viewed from the position at which each microstrip line 6B is connected to resonator 1B, microstrip line 6B functions as an electrically short-circuited end with respect to the fundamental wave component f0, so that this connection serves as a null potential point.

Four first output lines 3A are routed on the one principal surface of substrate 4. These first output lines 3A are connected to microstrip line resonator 1B at respective midpoints between the left and top ends, between the top and right ends, between the right and bottom ends, and between the bottom and left ends of microstrip line resonator 1B, respectively. Specifically, first output lines 3A are connected at four points distanced by $\lambda/8$ from the positions at which the negative resistive active devices are connected to microstrip line resonator 1B in the clockwise direction and in the counter-clockwise direction. The distal ends of first output lines 3A are commonly connected at the center point of the annular ring formed by microstrip line resonator 1B. At this common connection, substrate 3 is formed with via-hole 7 to which a second output line, not shown, is connected. In this configuration, when first output lines 3A are formed in a linear shape, each first output line 3A has a length shorter than $\lambda/4$.

In the configuration as described above, since the left and right ends of microstrip line resonator 1B are separated by one-half wavelength of fundamental wave f0, the left and right ends are electrically opposite-phase points to each other. Then, since FETs 2A are connected to the left and right ends, respectively, there are formed two oscillation systems which oscillate at the fundamental frequency of fundamental wave f0 and are in a mutually opposite-phase relationship, as with the cases of the first and second embodiments as described above.

In the foregoing configuration, generated on microstrip line resonator 1B is a rounding standing wave at the fundamental frequency f0 which has mutually opposite-phase maximum displacement distribution points at the left and right ends, and null potential points at the top and bottom ends. In this event, considering each standing wave at fundamental frequency f0 in the upper half circle and lower half circle divided by a diameter which connects the left and right ends of microstrip line resonator 1B, this standing wave is substantially identical to the standing wave which is generated in linear microstrip line resonator 1A having a length of λ/2 in the first and second embodiments. Then, the distribution of the standing wave is in phase to each other on both sides of the diameter which connects the left and right ends. Therefore, the distributions for the standing waves of the fundamental wave f0 and respective higher-order harmonics are the same as the distributions represented in FIGS. 7A, 7B, 7C and 8 which present the respective standing waves that are continuously extended on the assumption that the linear microstrip line resonator is increased in length by a factor of two.

In this configuration, the top and bottom ends of microstrip line resonator 1B correspond to the midpoint of microstrip line resonator 1A illustrated in FIG. 5. Then, first output lines 3A are connected to symmetric points distanced by λ/8 from the top end and bottom end, respectively, of microstrip line resonator 1B. As a result, as is the case with the first embodiment, in regard to fundamental wave f0 and its odd-order harmonics, the potentials of the standing waves are in opposite phases to each other at positions, at which first output lines 3A are connected to resonator 1B, on both sides of the top and bottom ends of resonator 1B. Therefore, these potentials in opposite phases are canceled out at the position of via hole 7 to result in null potential, thus preventing fundamental wave f0 and odd-order harmonic components from appearing. The standing wave of second harmonic 2f0 has null potential at the positions at which first output lines 3A are connected to resonator 1B, as is the case with the first embodiment. As such, a second harmonic component does not appear either. On the other hand, in regard to fourth harmonic 4f0, fourth harmonic 4f0 has mutually in-phase maximum displacement distribution points at positions of resonator 1B at which first output lines 3A are connected. Thus, this high frequency oscillator delivers the fourth harmonic component 4f0. Likewise, in this configuration, the high frequency oscillator does not deliver fifth or higher odd-order harmonics, delivers sixth or higher even-order harmonics at relatively low levels which can be suppressed by a simple filter, and can therefore deliver fourth harmonic 4f0 alone.

In the fourth-harmonic oscillator illustrated in FIG. 13, first output lines 3A are connected at a total of four points of microstrip line resonator 1B at the midpoints between the left and top ends, between the top and right ends, between the right and bottom ends, and between the bottom and left ends of microstrip line resonator 1B, respectively, with the distal ends of first output lines 3A being connected in common at the center of the annular ring. Alternatively, another configuration may be employed as well.

Figure 14:
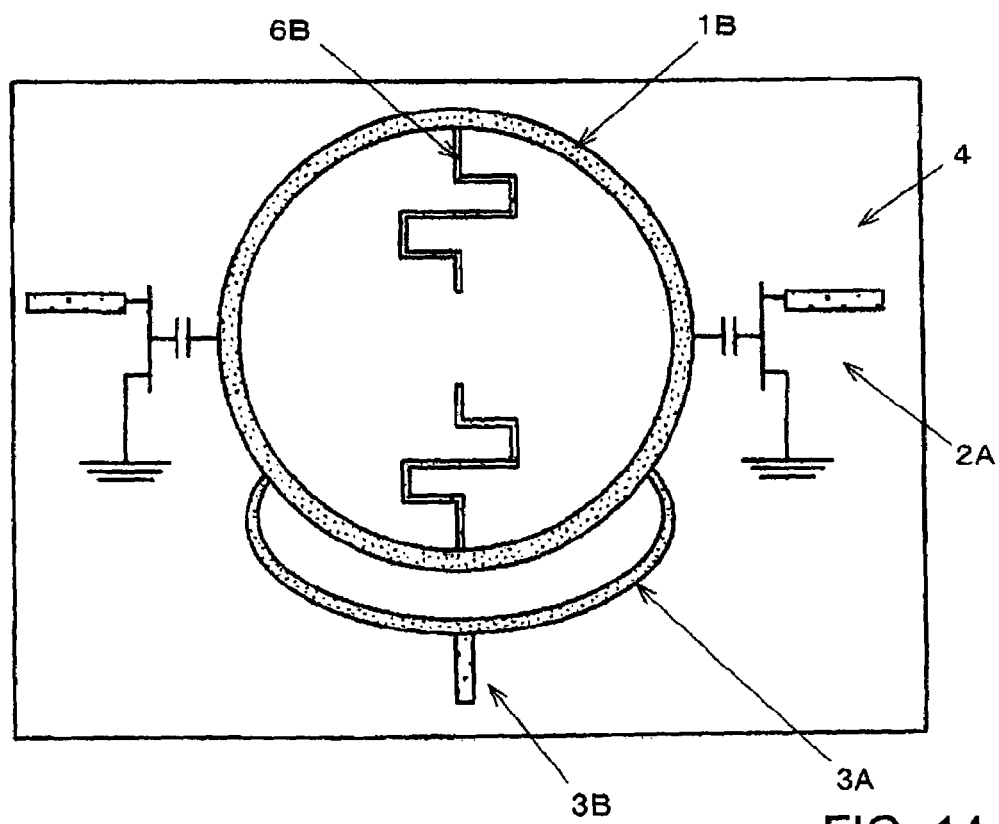
FIG. 14 is a plan view illustrating another exemplary fourth-harmonic oscillator based on the third embodiment.

A fourth-harmonic oscillator illustrated in FIG. 14, though similar to the oscillator illustrated in FIG. 13, differs in a way in which output lines 3A, 3B are connected to microstrip line resonator 1B. Specifically, first output lines 3A are connected, for example, to the lower half circle of microstrip line resonator 1B, and first output lines 3A are extended outward away from annular resonator 1B. More specifically, first output lines 3A are connected to microstrip line resonator 1B at a midpoint between the left end and, bottom end of resonator 1B and at a midpoint between the right end and bottom end of resonator 1B, respectively. The distal ends of first output lines 3A are commonly connected to second output line 3B. In this configuration, due to the suppression of the fundamental wave and multiple harmonics other than fourth harmonic 4f0, fourth harmonic 4f0 alone can be delivered from second output line 3B. In the illustrated oscillator, first output lines 3A are formed into an arcuate shape to have a length of λ/4.

Further, for maintaining the symmetry in resonator 1B, similar first output lines 3A and second output line 3B may be additionally provided on the upper half circle of resonator 1B. In this configuration, the resulting high frequency oscillator is a two-output type because outputs are delivered from the upper half circle and lower half circle, respectively.

While an exemplary fourth-harmonic oscillator has been described above, this embodiment can also be applied to an eighth-harmonic oscillator and higher 2n-th (n is an integer equal to or larger than five) harmonic oscillators, as is the case with the use of linear microstrip line resonator 1.

Figure 15A:
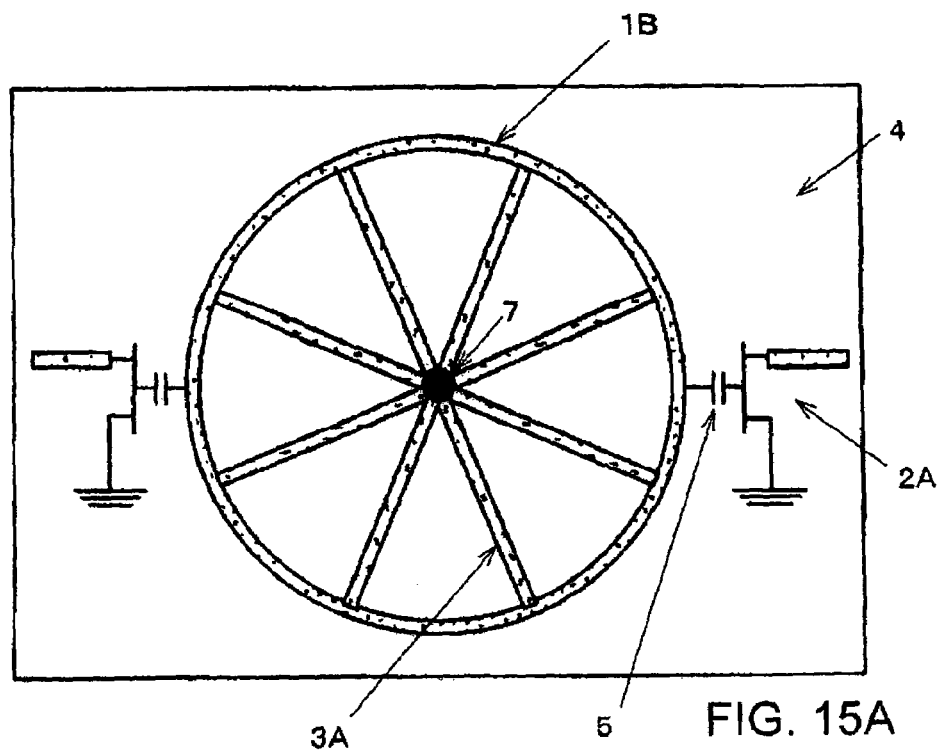
FIGS. 15A,B are plan views illustrating an eighth-harmonic oscillator based on the third embodiment.

A high frequency oscillator illustrated in FIG. 15A is an eighth-harmonic oscillator. Here, like the one illustrated in FIG. 13, negative resistive active devices (FETs 2A) are connected to annular microstrip line resonator 1B at a left and a right end of resonator 1B, respectively, through capacitors 5 for loose coupling. Then, eight first output lines 3A are routed on the one principal surface of substrate 4. These first output lines 3A are connected to microstrip line resonator 1B at positions distanced by λ/16 from the left and right ends of resonator 1B and at positions distanced by λ/16 from a top and a bottom ends of resonator 1B, respectively. In other words, first output lines 3A are connected to resonator 1B at regular intervals of λ/8 on the circumference of resonator 1B. The distal ends of these first output lines 3A are commonly connected at the center of the annular ring formed by resonator 1B, and are extended through via hole 7, formed through substrate 4, onto the back of substrate 4.

Figure 15B:
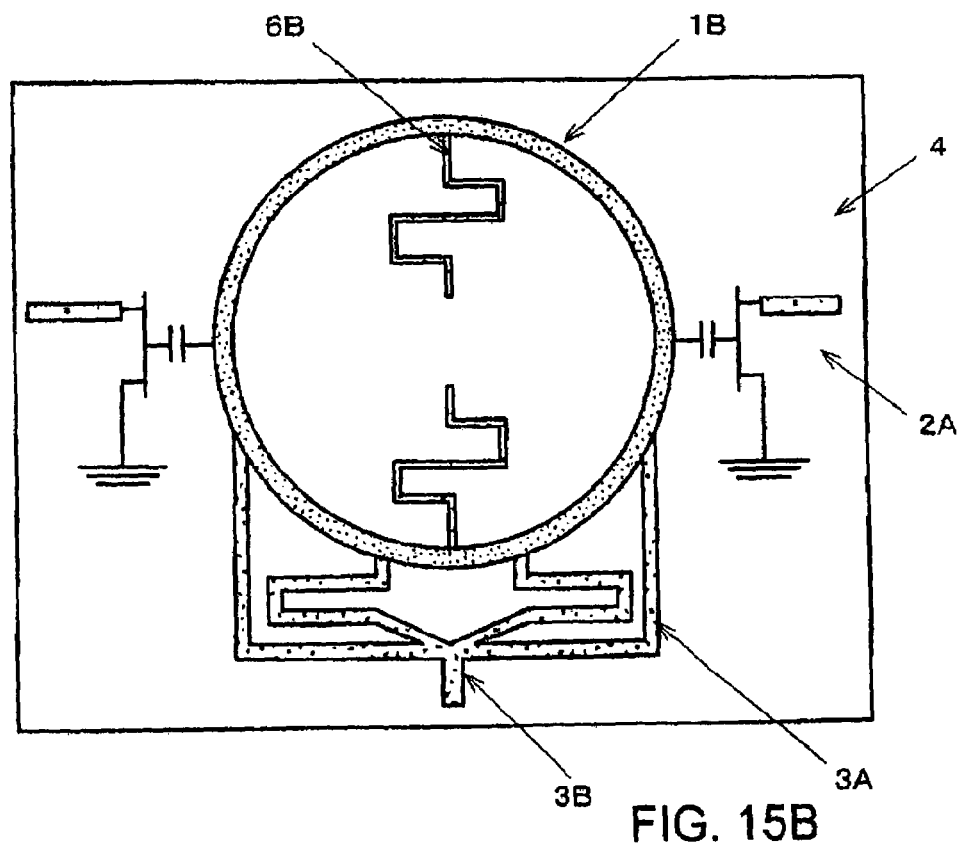

An eighth-harmonic oscillator illustrated in FIG. 15B is a modification to the fourth-harmonic oscillator illustrated in FIG. 14 into an eighth-harmonic oscillator. In this eighth-harmonic oscillator, four first output lines 3A are connected to a lower half circle of annular microstrip line resonator 1. First output lines 3A are connected at positions distanced by λ/16 from the bottom end of resonator 1B on both sides, respectively, at a position distanced by λ/16 from the right end of resonator 1B to the direction towards the bottom end, and at a position distanced by λ/16 from the left end of resonator 1B to the direction towards the bottom end. The distal ends of first output lines 3A are extended outward away from annular resonator 1B, and commonly connected to second output line 3B.

In the eighth-harmonic oscillators illustrated in FIGS. 15A and 15B, fundamental wave f0 and odd-order harmonic components do not appear on second output line 3B because they are combined in opposite phases at the distal ends of first output lines 3A. Among even-order harmonics, second harmonic 2f0 and sixth harmonic 6f0 are likewise combined in opposite phases at the distal ends of first output lines 3A. In regard to a fourth harmonic component 4f0, since first output lines 3A are connected to resonator 1B at null potential points, the fourth harmonic component does not appear either. Tenth or higher even-order harmonics have relatively low levels and can be removed by a simple filter. On the other hand, in regard to eighth harmonic 8f0, at positions of resonator 1B at which first output lines 3A are connected, eighth harmonic 8f0 has mutually in-phase maximum displacement distribution points, so that the eighth harmonic components from respective first output lines 3A are combined on second output line 3B in phase and delivered from second output line 3B. Thus, this eighth-harmonic oscillator delivers the eighth harmonic component 8f0 alone.

While the respective embodiments described above employ microstrip line resonators for the transmission line resonators, the present invention is not limited to this particular implementation of the transmission line resonators. In the following, description will be made on a high frequency oscillator according to a fourth embodiment which employs a slot line resonator for the transmission line resonator.

Figure 16A:
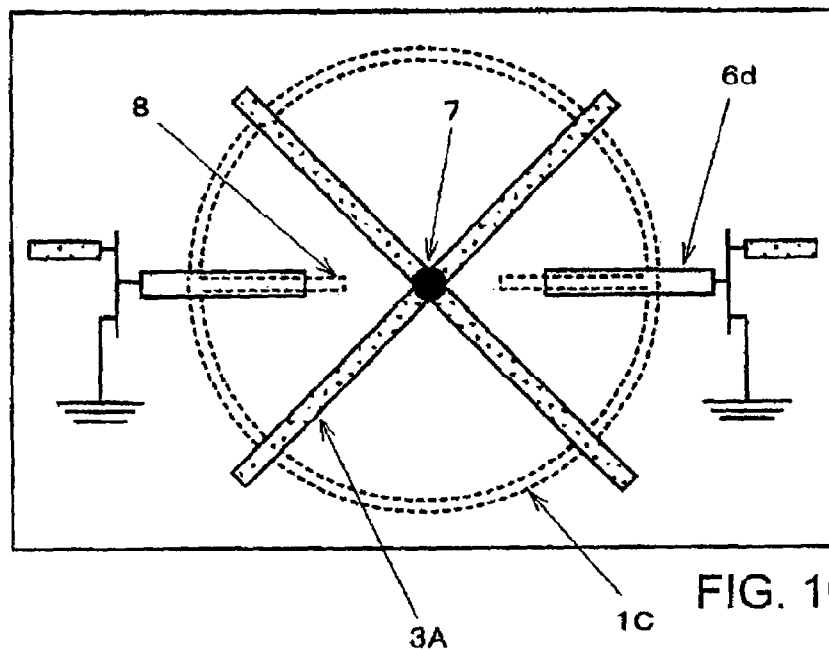
FIGS. 16A and 16B are plan views each illustrating a fourth-harmonic oscillator according to a fourth embodiment of the present invention.

A high frequency oscillator illustrated in FIG. 16A comprises slot line resonator 1C which is substituted for the microstrip line resonator in the fourth-harmonic oscillator illustrated in FIG. 13. Slot line resonator 1C is implemented by forming an elongated aperture line in the ground conductor disposed on the other principal surface of substrate 3 made of dielectric material, wherein the aperture line is routed in an annular shape to form annular slot line resonator 1C. Lead-out lines 8, which extend toward the center of annular slot line resonator 1C, are connected to slot line resonator 1C at a left and a right end position thereof, as shown in FIG. 16A. Lead-out lines 8 also have a slot line structure. Slot line resonator 1C has an overall length of λ, where λ is the wavelength corresponding to the fundamental frequency (fundamental wave f0) of oscillation.

On the one principal surface of substrate 4, microstrip lines 6d for electromagnetic coupling are superimposed on lead-out lines 8 and traverse slot line resonator 1C at the left and right ends of slot line resonator 1C. The degree of coupling between microstrip lines 6d and lead-out lines 8 can be adjusted by varying the length of the superimposed portion thereof.

FET 2A, which functions as a negative resistive active device, is connected at one end of each microstrip line 6d. In this event, the one end of microstrip line 6d is directly connected to a gate of FET 2A. In addition, four first output lines 3A having a microstrip line structure are routed on the one principal surface of substrate 4, in a manner similar to the oscillator illustrated in FIG. 13. Each first output line 3A has one end which extends to traverse resonator 1C at a position of a midpoint between a top and left end, between the left and bottom ends, between the bottom and right ends, or between the right and top end, and is electromagnetically coupled to slot line resonator 1 at the position at which first output line 3A traverses resonator 1C. First output lines 3A have the other ends commonly connected at the center of resonator 1, and are connected to a second output line, not shown, through via-hole 7.

In this configuration, slot line resonator 1C is electrically coupled to FETs 2A at its left and right ends by microstrip lines 6d. Therefore, there are formed two oscillation systems which are in a mutually opposite-phase relationship with respect to fundamental wave f0, as is the case with the fourth-harmonic oscillator having annular microstrip line resonator 1B illustrated in FIG. 13. In this event, a circulating standing wave of fundamental wave f0, which is formed on slot line resonator 1C, has mutually opposite-phase maximum displacement distribution points at the left and right ends of slot line resonator 1C, and null potential points at the top and bottom ends of resonator 1C.

In this configuration, fundamental wave f0 and their odd-order harmonic components are also combined in opposite phases at the position of via-hole 7 to have null potential, and are therefore not delivered to the output line, in a manner similar to that illustrated in FIG. 13. In regard to the second harmonic component 2f0, since the positions at which first output lines 3A traverse resonator 1C are null potential points for the standing wave of second harmonic 2f0 in resonator 1C, the second-harmonic component is not either delivered. Sixth or higher even-order harmonics are relatively low in level, or can be suppressed by a simple filter.

In regard to fourth harmonic 4f0, on the other hand, the positions at which respective first output lines 3A are coupled to resonator 1C are mutually in-phase maximum displacement distribution points for the standing wave of fourth harmonic 4f0 on resonator 1C. Then, since the fourth-harmonic components delivered from these points are combined in phase at the other ends of first output lines 3A, the fourth-harmonic component alone is eventually delivered from the oscillator illustrated in FIG. 16A.

Figure 16B:
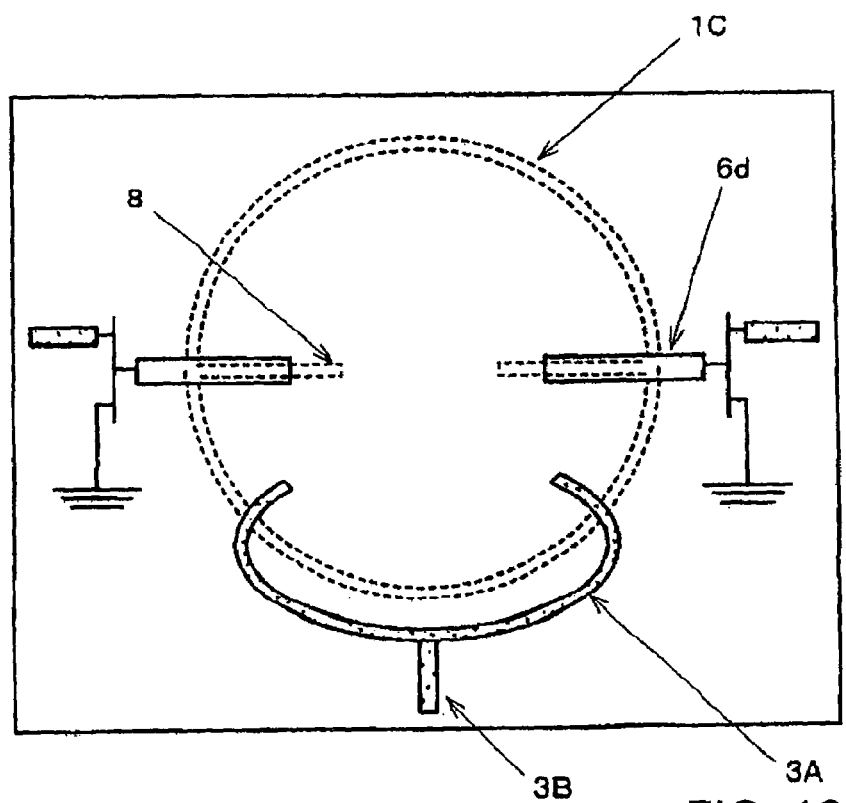

A high frequency oscillator illustrated in FIG. 16B is a fourth-harmonic oscillator which comprises slot line resonator 1C similar to that illustrated in FIG. 16A that is substituted for the microstrip line resonator in the oscillator illustrated in FIG. 14. A pair of first output lines 3A traverse slot line resonator 1C at positions distanced by λ/8 from the bottom end of slot line resonator 1C, respectively, extend outward from resonator 1C, and are commonly connected to second output line 3B.

The employment of a slot line resonator for a transmission line resonator is not limited to a fourth-harmonic oscillator, but can be applied to an eighth-harmonic oscillator and 2n-th harmonic oscillator, where n is an integer equal to or larger than five.

Figure 17A:
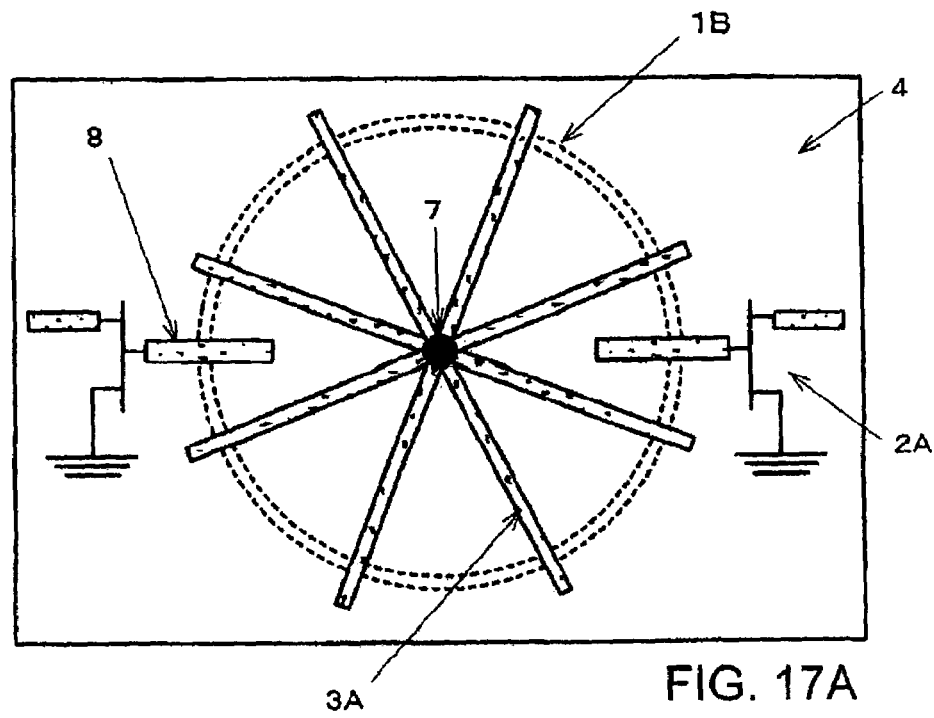
FIGS. 17A and 17B are plan views each illustrating an eighth-harmonic oscillator based on the fourth embodiment.
Figure 17B:
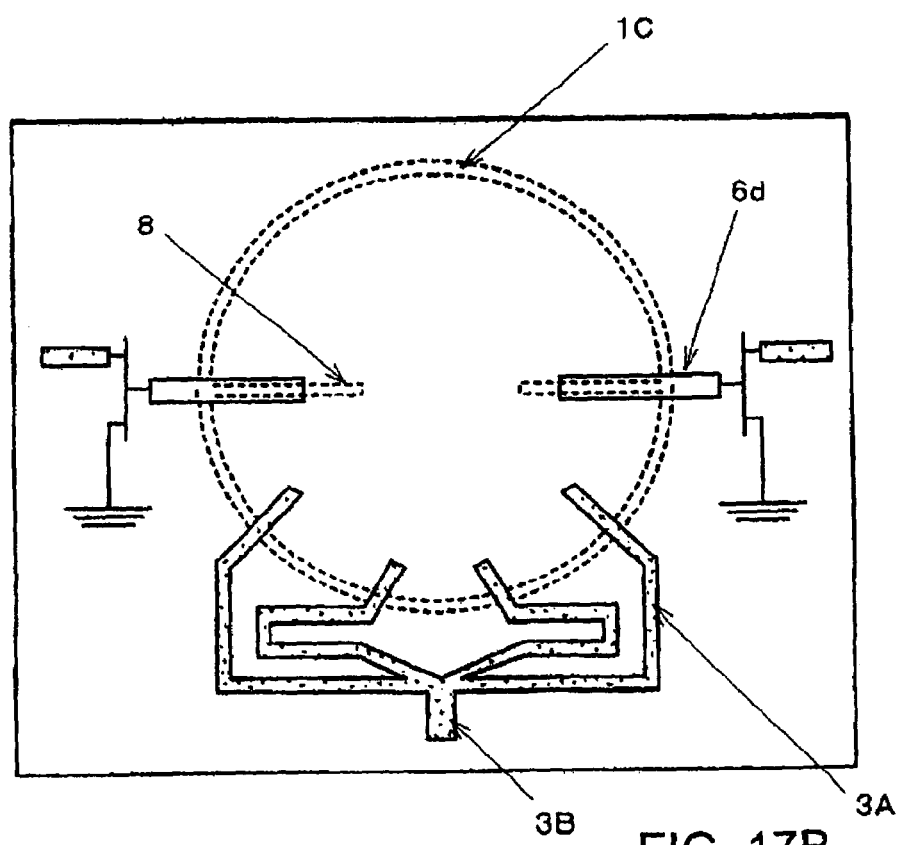

A high frequency oscillator illustrated in FIG. 17A is an eighth-harmonic oscillator which comprises slot line resonator 1C similar to that illustrated in FIG. 16A that is substituted for the microstrip line resonator in the oscillator illustrated in FIG. 15A. A high frequency oscillator Illustrated in FIG. 17B in turn is an eighth-harmonic oscillator which comprises slot line resonator 1C similar to that illustrated in FIG. 16A that is substituted for the microstrip line resonator in the oscillator illustrated in FIG. 15B.

Each of the foregoing embodiments has been described specifically on a fourth-harmonic oscillator or an eighth-harmonic oscillator based on the present invention. Generally, the transmission line resonator has a low Q-value, indicative of the sharpness of resonance, so that a synchronization signal may be injected into an oscillator from an external signal source (i.e., synchronization signal source) in order to increase the frequency stability of an oscillation frequency. In the following, description will be made on an injection locked oscillator which is injected with a synchronization signal in accordance with a fifth embodiment of the present invention.

Figure 18:
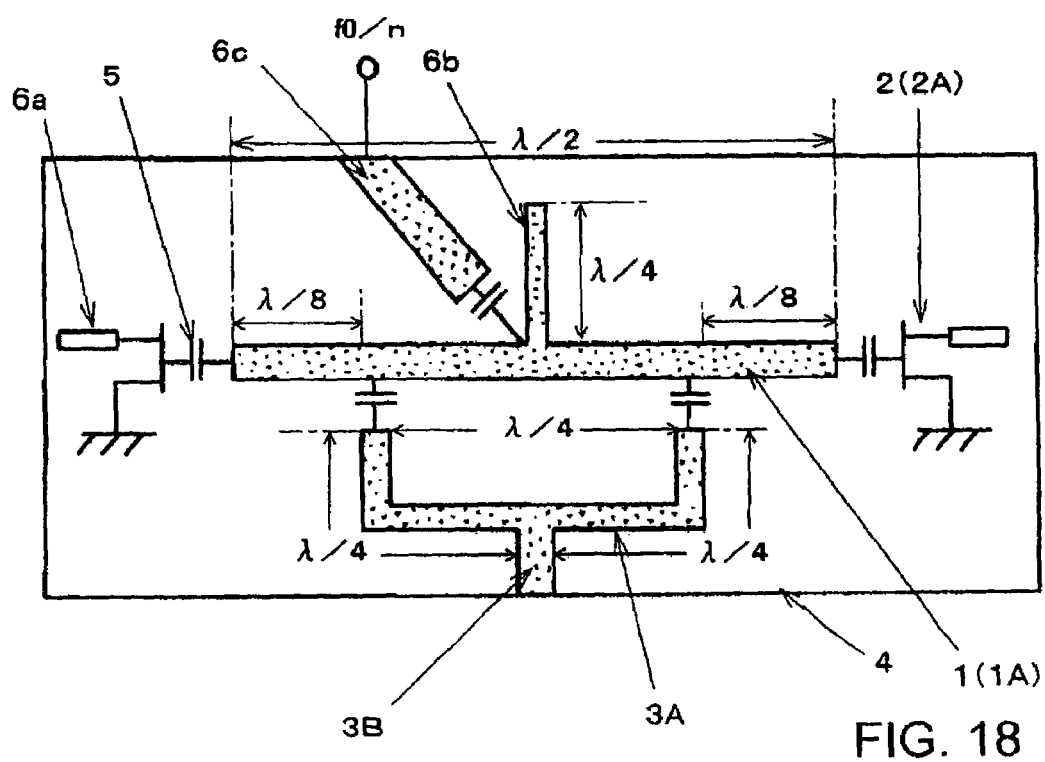
FIG. 18 is a plan view illustrating a fourth-harmonic oscillator according to a fifth embodiment of the present invention.

An oscillator illustrated in FIG. 18 is a modification to the fourth-harmonic oscillator illustrated in FIG. 5 in order that the oscillator can be injected with a synchronization signal. Microstrip line 6c is routed on the one principal surface of substrate 4 for injecting a synchronization signal. Microstrip line 6C has one end connected to a midpoint of microstrip line resonator 1A through capacitor 5 for loose coupling. Microstrip line 6C has the other end connected to an external signal source such as a crystal oscillator which supplies the synchronization signal with high frequency stability. The frequency of the synchronization signal is set at f0/n, where n is an integer equal to or larger than one. By injecting such a synchronization signal into microstrip line resonator 1 through microstrip line 6c, oscillated components of fundamental wave f0 are aligned in phase to the synchronization signal at time intervals of n/f0, thus improving the frequency stability of fundamental wave f0. This is accompanied with higher frequency stability of a generated fourth harmonic component 4f0.

Figure 19A:
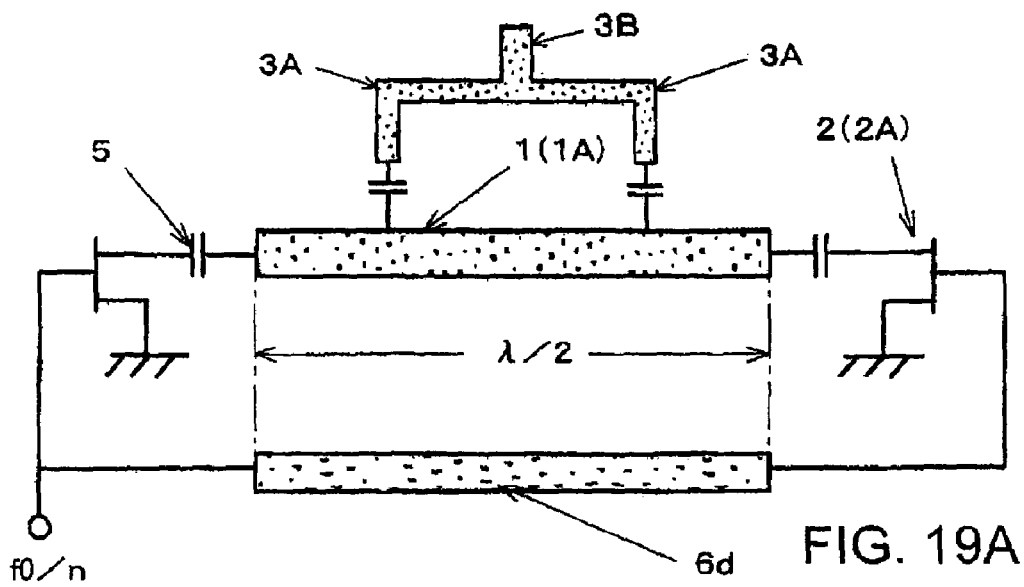
FIGS. 19A,B are plan views generally illustrating another exemplary fourth-harmonic oscillator based on the fifth embodiment.
Figure 19B:
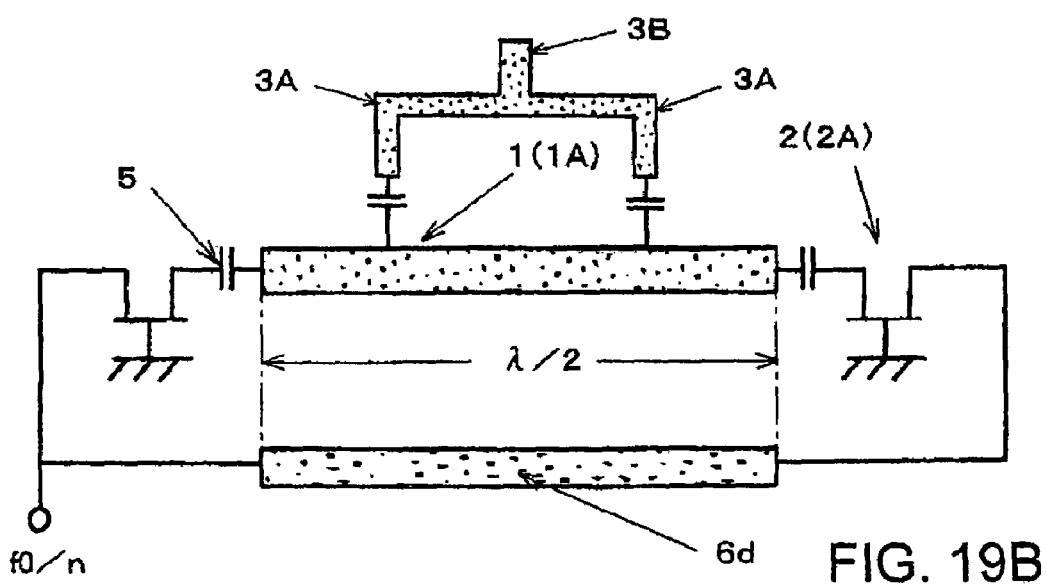

FIGS. 19A and 19B each illustrate a fourth-harmonic oscillator which comprises a delay line formed of microstrip line 6d between a pair of negative resistive active devices (FETs 2A) connected to both ends of microstrip line resonator 1A, respectively. Microstrip line 6d, which functions as a delay line, is routed on the one principal surface of substrate 4, and has a length of λ/2. One of the FETs is applied with a synchronization signal at frequency of f0/n from an external signal source, while the other FET is applied with the synchronization signal through the delay line from the same external signal source. As a result, FETs 2A at both ends of microstrip line resonator 1A are applied with the respective synchronization signals in opposite phases to each other, as the phase of fundamental wave f0, thus applying the synchronization signals in opposite phases to two oscillation systems which oscillate in opposite phases to each other. The fundamental wave component f0 is aligned in phase at time intervals of n/f0, resulting in higher frequency stability of fourth harmonic 4f0 which is generated from the oscillator.

The fourth-harmonic oscillator illustrated in FIG. 19A operates FETs 2A, the sources of which are grounded. Specifically, left-hand FET 2A as viewed in FIG. 19A has a grounded source, a drain connected to a left end of microstrip line resonator 1A through capacitor 5 for loose coupling, and a gate directly applied with the synchronization signal. On the other hand, right-hand FET 2A as viewed in FIG. 19A has a grounded source, a drain connected to a right end of microstrip line resonator 1A through capacitor 5 for loose coupling, and a gate applied with the synchronization signal through microstrip line 6d. Similar to the fourth-harmonic oscillator illustrated in FIG. 5, first output lines 3A are connected to microstrip line resonator 1A. These first output lines 3A have distal ends commonly connected to second output line 3B.

The fourth-harmonic oscillator illustrated in FIG. 19B operates FETs 2A, the gates of which are grounded, i.e., in a source follower configuration. Left-hand FET 2A has the gate grounded, a source connected to a left end of microstrip line resonator 1A through capacitor 5 for loose coupling, and a drain directly applied with the synchronization signal. On the other hand, right-hand FET 2A has the gate grounded, a source connected to a right end of microstrip line resonator 1A through capacitor 5 for loose coupling, and a drain applied with the synchronization signal through microstrip line 6d. In this configuration, first output lines 3A are connected to microstrip line resonator 1A, similar to the fourth-harmonic oscillator illustrated in FIG. 5, and these first output lines 3A have distal ends commonly connected to second output line 3B.

The fourth-harmonic oscillators illustrated in FIGS. 19A and 19B, the synchronization signal is not directly injected into the microstrip line resonator, but to the negative resistive active devices connected to the microstrip line resonator, thus maintaining the independence of microstrip line resonator 1A and a load Q-value of the resonator.

Also, since FETs 2A are grounded at the source and gate, respectively, the configuration of the injection locked systems can be simplified by the unilateral property of the FETs under such an operating condition.

While the injection locking is implemented in fourth-harmonic oscillators in the foregoing description, it should be understood that the injection locking can be applied to eighth or higher even-order harmonic oscillators. Also, when a slot line resonator is used for a transmission line resonator, the injection locking can be practiced with a similar configuration to increase the frequency stability of oscillation.

In the respective embodiments described above, the negative resistive active devices and first output lines are connected to the microstrip line resonator through capacitors for loose coupling, but the capacitors may be omitted so that the negative resistive active devices and first outputs are directly connected to the microstrip line resonator. However, as described above, the connection of the negative resistive active devices and first output lines to the microstrip line resonator through loose coupling is advantageous in that the load Q-value of the resonator is not degraded.

While FETs are employed for the negative resistive active devices in the embodiments described above, the negative resistive active devices employed in the present invention are not limited to FETs. Any devices or circuits can be employed in the present invention for the negative resistive active devices as long as they have substantially negative resistive characteristics in a desired frequency band. For example, bipolar transistors can be used as well.

Also, while microstrip line 6b, which functions as a quarter wavelength stub for fundamental wave f0, is connected to the midpoint of microstrip line resonator 1A to force the midpoint to be a null potential point, the provision of such microstrip line 6b is not essential. In other words, even without microstrip line 6b as a stub, the midpoint of resonator 1A is geometrically a null potential point because both ends of microstrip line resonator 1A are basically opened, so that the resulting resonator functions in a manner similar to the foregoing.

While microstrip line resonator 1A has a length of λ/2, where λ is the wavelength corresponding to fundamental wave f0, the length of the linear resonator is not limited to this particular value. More generally, microstrip line resonator 1A can have a length of (2m−1)×λ/2, where m is an integer equal to or larger than one. In essence, negative resistive active devices may be connected to a pair of mutually opposite-phase maximum displacement distribution points, respectively, to form two oscillation systems which can oscillate in opposite phases to each other.

In the foregoing description, the loop-shaped transmission line resonator is formed in an annular shape, but it may be, for example, in an oval-shaped loop, or a loop shape having corners, as long as it has a length equal to the wavelength of fundamental wave f0. For purposes of achieving a high power fourth-harmonic oscillator, the loop-shaped transmission line resonator may not be provided with microstrip lines 6B which function as quarter wavelength stubs for the fundamental wave, but instead with additional negative resistive active devices which are connected to the loop-shaped transmission line resonator at positions at which microstrip lines 6B would be connected, so that a total of four negative resistive active devices are included in the oscillator. Similarly, for achieving a high power eighth-harmonic oscillator, additional negative resistive active devices may be connected at the maximum voltage displacement points at which the eighth harmonic is in opposite phase to that at the positions of the resonator at which first output lines 3A are connected. In these events, these negative resistive active devices are preferably arranged in a symmetric form as a whole.

While the high frequency oscillator of the present invention has been described in connection with several examples of fourth-harmonic oscillators and eighth-harmonic oscillators which are configured in accordance with the present invention, the present invention can be basically applied to fourth or higher even-order harmonic oscillators. The high frequency oscillator based on the present invention can be readily incorporated into MMIC (Monolithic microwave integrated circuit) in high frequency bands such as a millimeter-wave band, and therefore advantageously lends itself to a reduction in size.

What is claimed is:

1. A high frequency oscillator comprising:
a transmission line resonator having a midpoint which serves as a null potential point;
a pair of active devices for oscillation respectively connected to a pair of resonance wave points for said transmission line resonator, said resonance wave points being in a mutually opposite-phase relationship; and
a plurality of output lines each having one end connected to said transmission line resonator at a point symmetric to said midpoint, and the other end commonly connected to a connection, wherein:
said pair of active devices share said transmission line resonator as a high frequency resonator to make up a pair of oscillation systems which oscillate in opposite phases to each other at a fundamental frequency depending on length of said transmission line resonator,
a standing wave of an even-order harmonic of said fundamental frequency has one of maximum displacement distribution points at said midpoint on said transmission line resonator,
said plurality of output lines are coupled to said transmission line resonator respectively at maximum displacement distribution points for a standing wave of an 2n-th harmonic on said transmission line resonator, said standing wave being in opposite phase to that at said midpoint, where n is an integer equal to or larger than two, and
even-order harmonic components of 2(n−1)-th or lower are suppressed at said connection.

2. The oscillator according to claim 1, wherein said transmission line resonator has a length of $\lambda/2$, where $\lambda$ is a wavelength corresponding to said fundamental frequency.

3. The oscillator according to claim 1, wherein said transmission line resonator is formed in a linear shape, and said pair of resonance wave points are at a pair of end points of said transmission line resonator.

4. The oscillator according to claim 3, wherein said transmission line resonator comprises a microstrip line resonator.

5. The oscillator according to claim 2, wherein said transmission line resonator comprises a microstrip line formed in a linear shape, and said pair of resonance wave points are at a pair of end points of said transmission line resonator.

6. The oscillator according to claim 1, wherein each of said output lines has a length of $\lambda/4$, where $\lambda$ is a wavelength corresponding to said fundamental frequency.

7. The oscillator according to claim 5, wherein said oscillator generates a fourth harmonic of said fundamental frequency when n is equal to two.

8. The oscillator according to claim 7, wherein said plurality of output lines comprises two output lines, said two output lines being coupled to said microstrip line resonator respectively at a position distanced by $\lambda/4$ and a position distanced by $3\lambda/4$ from one end of said microstrip line resonator.

9. The oscillator according to claim 5, wherein said oscillator generates an eighth harmonic of said fundamental frequency when n is equal to four.

10. The oscillator according to claim 9, wherein said plurality of output lines comprises four output lines, said four output lines being coupled to said microstrip line resonator respectively at positions distanced by $\lambda/8$, $3\lambda/8$, $5\lambda/8$, and $7\lambda/8$ from one end of said microstrip line resonator.

11. The oscillator according to claim 1, wherein said transmission line resonator is formed in an annular shape, and said pair of resonance wave points are at two points which divide said transmission line resonator into two sections having an equal length, wherein said midpoint is defined at a point equally distanced from both of said pair of resonance wave points for said transmission line resonator.

12. The oscillator according to claim 11, wherein said transmission line resonator has a length of $\lambda$, where $\lambda$ is a wavelength corresponding to said fundamental frequency.

13. The oscillator according to claim 12, wherein said transmission line resonator comprises a microstrip line resonator.

14. The oscillator according to claim 12, wherein said transmission line resonator comprises a slot line resonator.

15. The oscillator according to claim 12, wherein said oscillator generates a fourth harmonic of said fundamental frequency when n is equal to two.

16. The oscillator according to claim 12, wherein said oscillator generates an eighth harmonic of said fundamental frequency when n is equal to four.

17. The oscillator according to claim 11, wherein said output lines are coupled to said transmission line resonator only in one of said two sections having the equal length.

18. The oscillator according to claim 1, further comprising means for distorting output waveforms of said pair of active devices to increase level of a harmonic component.

19. The oscillator according to claim 1, further comprising means for injecting a synchronization signal to each of said oscillation systems from an external signal source.

20. The oscillator according to claim 1, further comprising means for injecting a synchronization signal into said midpoint from an external signal source.

21. The oscillator according to claim 1, further comprising means for injecting synchronization signals into said pair of active devices from an external signal source, such that the synchronization signals are injected said pair of active devices in opposite phases to each other, as converted to said fundamental frequency.

* * * * *